(12) United States Patent
Sercel et al.

(10) Patent No.: US 8,986,497 B2
(45) Date of Patent: Mar. 24, 2015

(54) LASER LIFT OFF SYSTEMS AND METHODS

(75) Inventors: Jeffrey P. Sercel, Hollis, NH (US);
Marco Mendes, Manchester, NH (US);
Jie Fu, Marlborough, MA (US)

(73) Assignee: IPG Photonics Corporation, Oxford, MA (US)

( * ) Notice: Subject to any disclaimer, the term of this patent is extended or adjusted under 35 U.S.C. 154(b) by 887 days.

(21) Appl. No.: 12/962,068

(22) Filed: Dec. 7, 2010

(65) Prior Publication Data
US 2011/0132549 A1 Jun. 9, 2011

Related U.S. Application Data

(60) Provisional application No. 61/267,194, filed on Dec. 7, 2009.

(51) Int. Cl.
*B32B 38/10* (2006.01)
*B23K 26/40* (2014.01)

(52) U.S. Cl.
CPC ......... *B23K 26/4075* (2013.01); *B23K 2201/40* (2013.01); *Y10S 156/93* (2013.01)
USPC .............................. 156/712; 156/930; 438/458

(58) Field of Classification Search
USPC .................... 438/458; 156/712, 753, 930, 941
See application file for complete search history.

(56) References Cited

U.S. PATENT DOCUMENTS

| | | | |
|---|---|---|---|
| 6,455,340 B1 | 9/2002 | Chua | |
| 6,562,648 B1 | 5/2003 | Wong | |
| 6,617,261 B2 | 9/2003 | Wong et al. | |
| 7,105,857 B2 | 9/2006 | Nagahama et al. | |
| 7,112,456 B2 | 9/2006 | Park et al. | |
| 7,202,141 B2 * | 4/2007 | Park et al. ..................... | 438/458 |

(Continued)

FOREIGN PATENT DOCUMENTS

| | | |
|---|---|---|
| JP | 2003234542 | 8/2003 |
| JP | 2003249453 | 9/2003 |

(Continued)

OTHER PUBLICATIONS

Machine Translation of KR100902150B, Jun. 2009.*

(Continued)

*Primary Examiner* — Mark A Osele
(74) *Attorney, Agent, or Firm* — Grossman Tucker Perreault & Pfleger, PLLC

(57) ABSTRACT

Laser lift off systems and methods may be used to provide monolithic laser lift off with minimal cracking by reducing the size of one or more beam spots in one or more dimensions to reduce plume pressure while maintaining sufficient energy to provide separation. By irradiating irradiation zones with various shapes and in various patterns, the laser lift off systems and methods use laser energy more efficiently, reduce cracking when separating layers, and improve productivity. Some laser lift off systems and methods described herein separate layers of material by irradiating non-contiguous irradiation zones with laser lift off zones (LOZs) that extend beyond the irradiation zones. Other laser lift off systems and methods described herein separate layers of material by shaping the irradiation zones and by controlling the overlap of the irradiation zones in a way that avoids uneven exposure of the workpiece. Consistent with at least one embodiment, a laser lift off system and method may be used to provide monolithic lift off of one or more epitaxial layers on a substrate of a semiconductor wafer.

30 Claims, 24 Drawing Sheets

(56) References Cited

U.S. PATENT DOCUMENTS

| | | | |
|---|---|---|---|
| 7,833,463 B1* | 11/2010 | Munson et al. | 264/400 |
| 8,198,113 B2* | 6/2012 | Nihei et al. | 438/46 |
| 8,313,961 B2* | 11/2012 | Ryu | 438/22 |
| 2002/0146893 A1 | 10/2002 | Shimoda et al. | |
| 2003/0114017 A1 | 6/2003 | Wong et al. | |
| 2005/0239270 A1 | 10/2005 | Fehrer et al. | |
| 2006/0148186 A1 | 7/2006 | Lee et al. | |
| 2007/0295952 A1 | 12/2007 | Jang et al. | |
| 2007/0298587 A1 | 12/2007 | Park et al. | |
| 2008/0023691 A1 | 1/2008 | Jang et al. | |
| 2008/0182353 A1 | 7/2008 | Zimmerman et al. | |
| 2008/0258165 A1 | 10/2008 | Zimmerman et al. | |
| 2008/0261341 A1 | 10/2008 | Zimmerman et al. | |
| 2009/0011614 A1 | 1/2009 | Bruland et al. | |
| 2009/0117707 A1 | 5/2009 | Shimomura et al. | |
| 2014/0102643 A1* | 4/2014 | Porneala et al. | 156/712 |

FOREIGN PATENT DOCUMENTS

| | | |
|---|---|---|
| JP | 2007525016 | 8/2007 |
| KR | 1020010101803 | 11/2001 |
| KR | 10 2004 5612 | 1/2004 |
| KR | 1020060059891 | 6/2006 |
| KR | 1020070122120 | 12/2007 |
| KR | 100902150 B * | 6/2009 |
| WO | 0047361 | 8/2000 |
| WO | 03065420 | 8/2003 |
| WO | 2004109764 | 12/2004 |
| WO | 2005008740 | 1/2005 |
| WO | 2007136183 | 11/2007 |
| WO | 2007148866 | 12/2007 |
| WO | 2008078952 | 7/2008 |

OTHER PUBLICATIONS

Japanese office action with English translation dated Feb. 14, 2012, received in corresponding Japanese Patent Application No. 2007-506445, 5 pgs. Cited references/English language equivalents previously cited in IDS filed Jun. 14, 2011.

Chinese Office Action and English language summary issued Aug. 19, 2014, received in corresponding Chinese Patent Application No. 201080055594.6, 14 pgs.

JPSAP Sercel Associates, Inc., "Price Quote Documents," dated Jan. 17, 2000, Nov. 7, 2002, Nov. 4, 2002, Jul. 24, 2003 and Mar. 18, 2003.

Notice of Preliminary Rejection with English translation dated Oct. 30, 2007, received in corresponding Korean Application No. 2006-7022455, 7 pgs.

Foreign office action dated Jul. 4, 2008 received in corresponding Chinese Application No. 200580015231.9, 6 pgs.

English language translation of Complaint for Invalidation of Korean Patent Registration No. 849779.

Chinese Office Action dated Nov. 13, 2009 issued in related Chinese Patent Application No. 20050015231.9.

Third Party Observation submitted in related Japanese Application No. 2007506445 on Dec. 4, 2009 and reported by Japanese Patent Office on Jan. 12, 2010 (Japanese Notification 4 pages; English language translation of Third Party Observation 8 pages).

EPO Office Action dated Apr. 28, 2010 received in corresponding EPO Application No. 05 731 585.5, 6 pgs.

Third Party Observation dated Aug. 3, 2010 issued in Japanese Patent Application 2007-506445 and reported by the Japanese Patent Office Aug. 26, 2010; English language translation included, 6 pages.

Japanese Office Action dated Nov. 16, 2010 issued in Japanese Patent Application 2007-506445, 6 pages.

International Search Report and Written Opinion issued Feb. 8, 2011 in PCT International Patent Application No. PCT/US10/59243, 16 pages.

Anvik, Novel, Large-Area, High-Resolution, High-Throughput Lithography and Via Generation System Technology, downloaded from internet Nov. 11, 2009, www.anvik.com.technology.html, 6 pages.

Kelly et al., Large Free-Standing GaN Substrates by Hydride Vapor Phase Epitaxy and Laser-Induced Liftoff, Japanese Journal of Applied Physics, vol. 38 p. L217, 1999.

Wong et al., Fabrication of thin-film InGan light-emitting diode membranes by laser lift-off, Applied Physics Letters, vol. 75 p. 1360, 1999.

Peyre, et. al., Laser shock processing of materials, physical processes involved and examples of applications, Journal of Laser Applications, vol. 8 pp. 135-141, 1996.

* cited by examiner

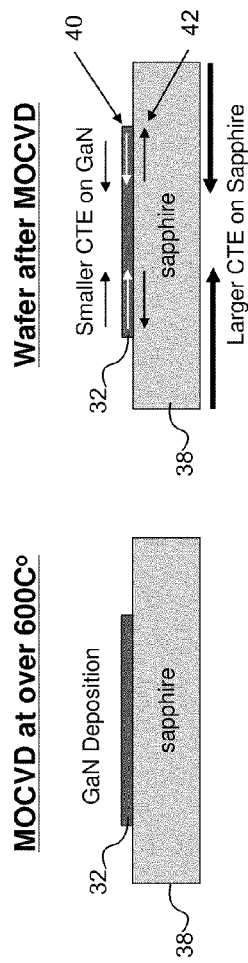
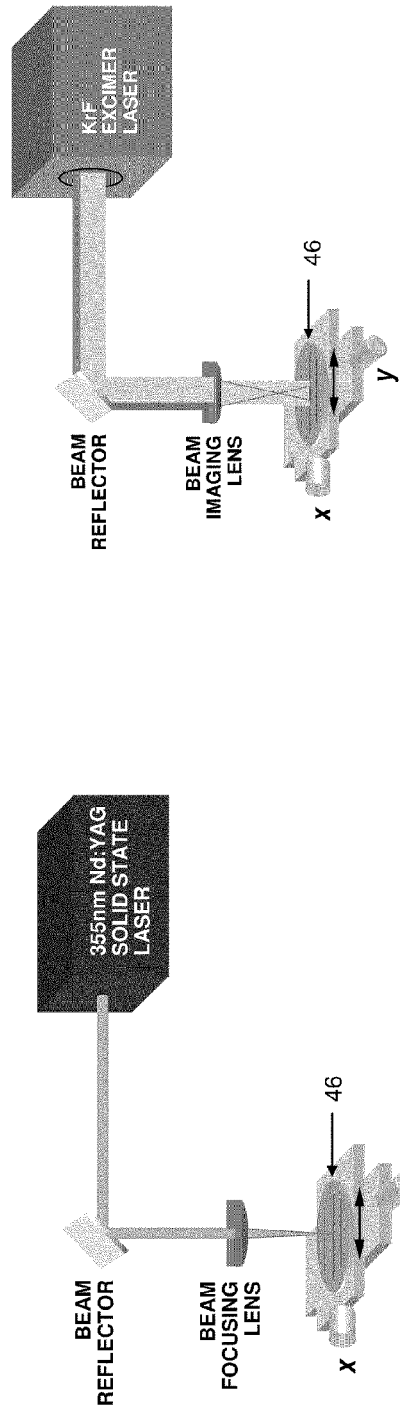

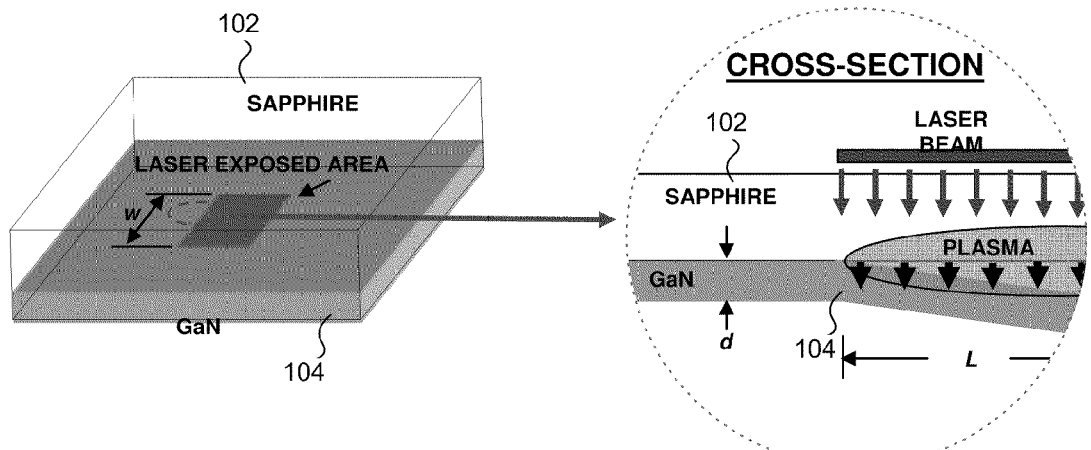
FIG. 7
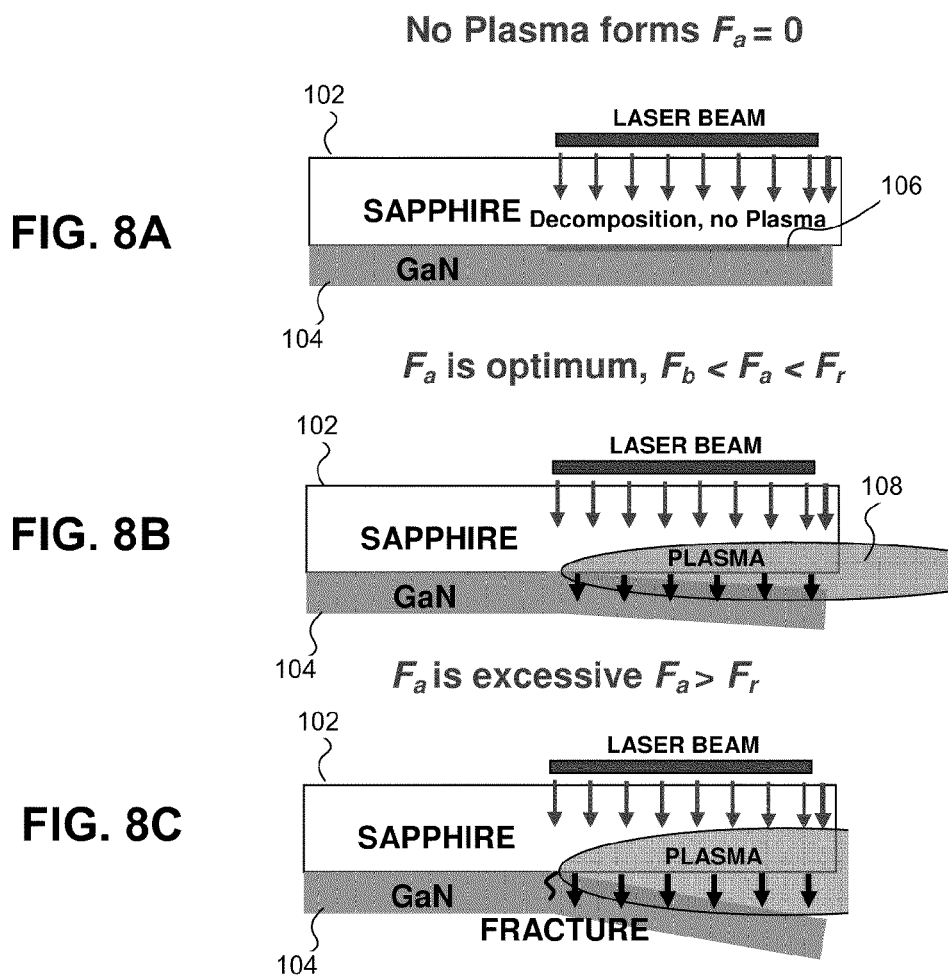
FIG. 8A
FIG. 8B
FIG. 8C

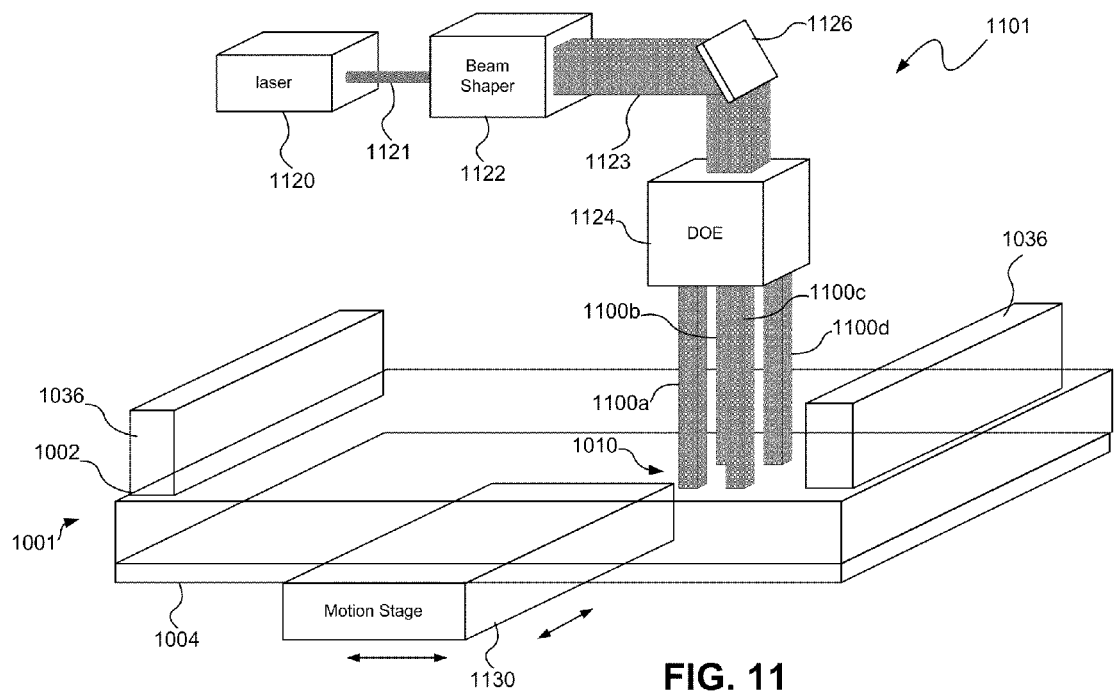
FIG. 11
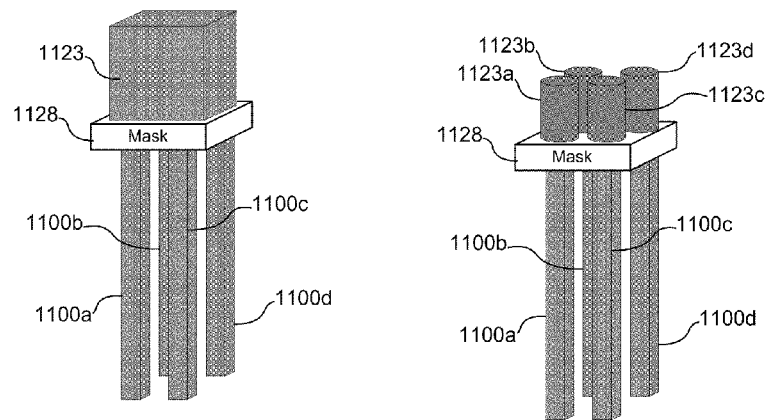
FIG. 12A  FIG. 12B

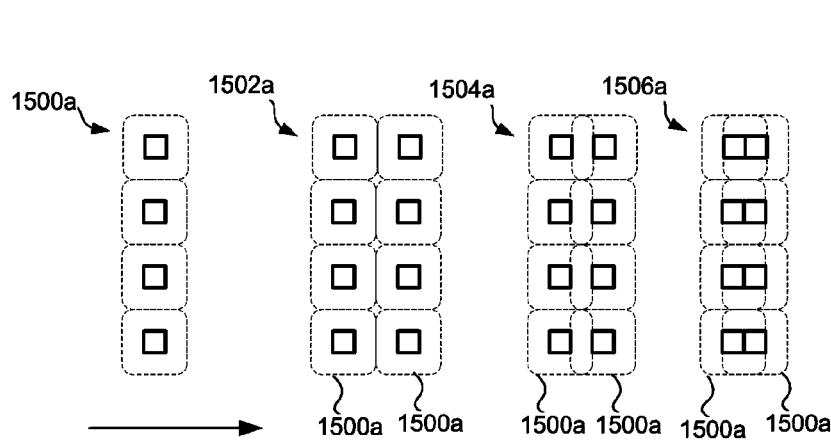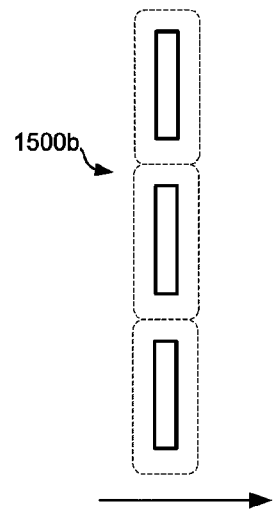
FIG. 15A
FIG. 15B
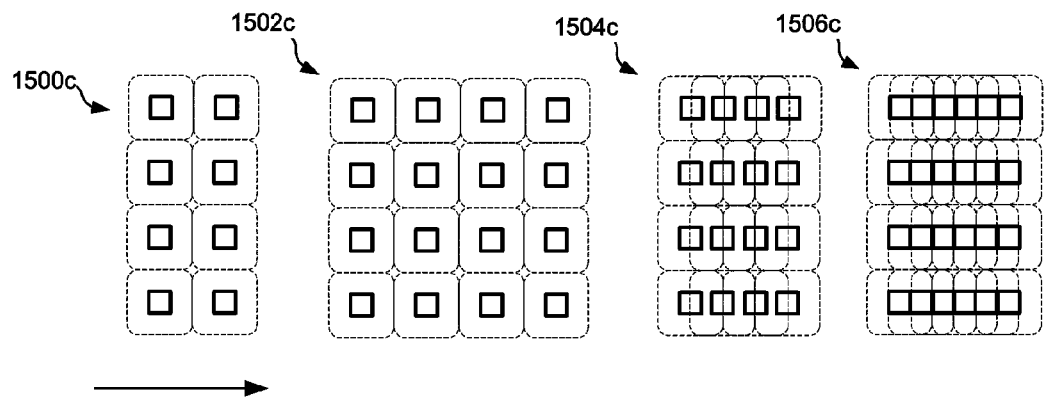
FIG. 15C
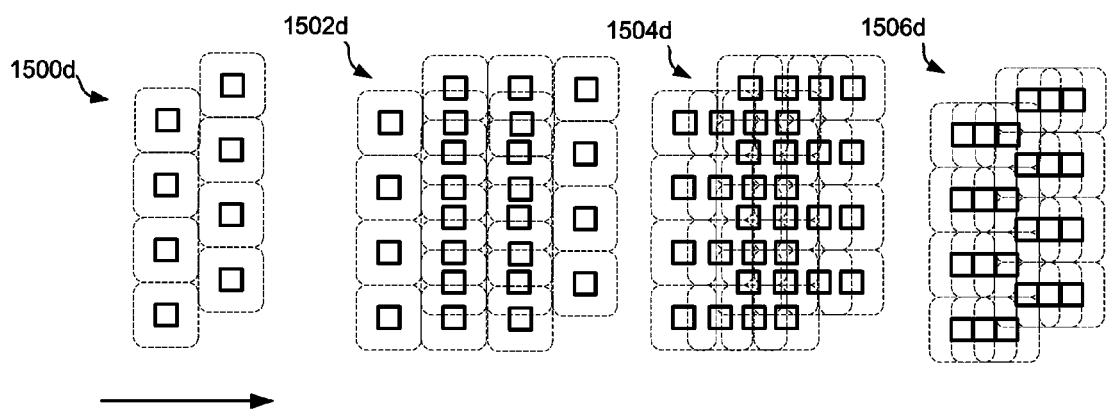
FIG. 15D

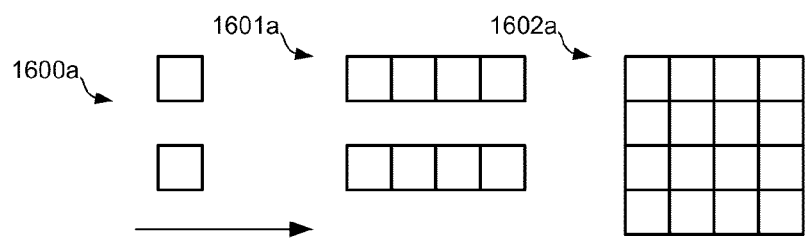
FIG. 16A
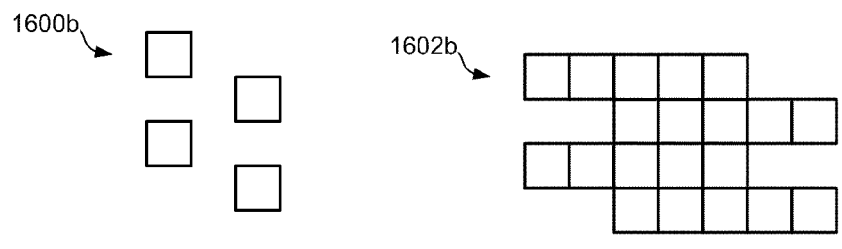
FIG. 16B
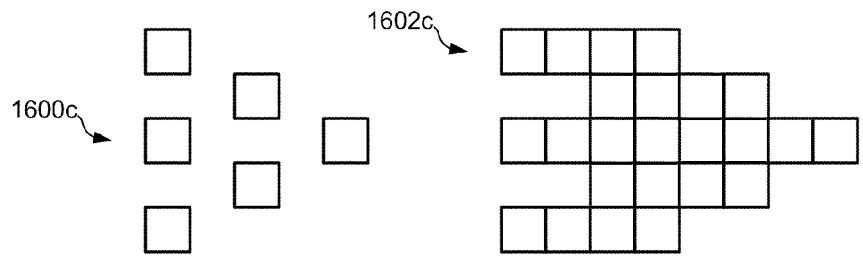
FIG. 16C
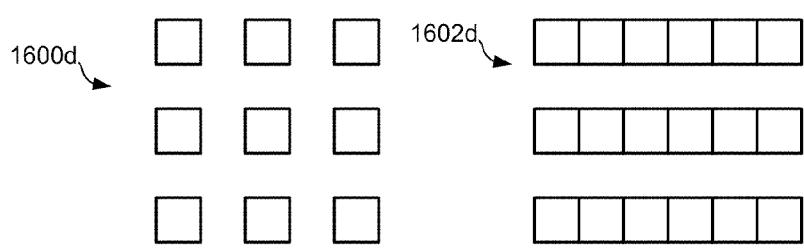
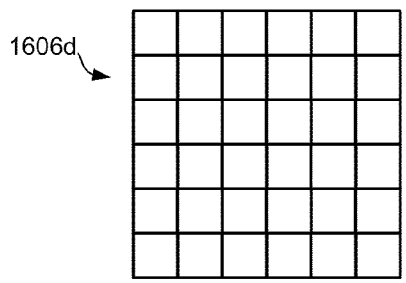
FIG. 16D

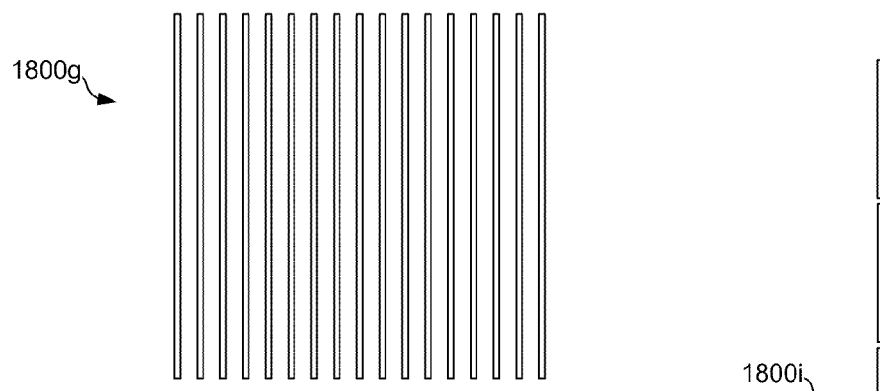
FIG. 18G
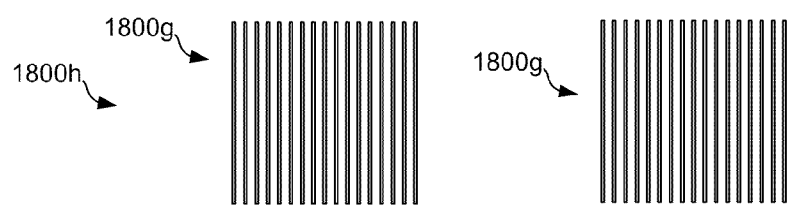
FIG. 18H
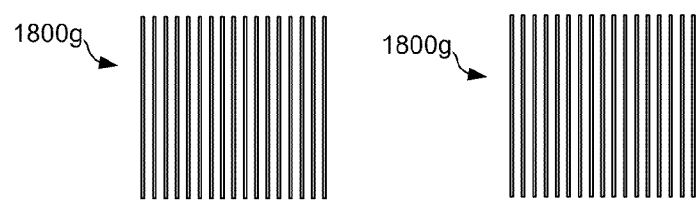
FIG. 18I
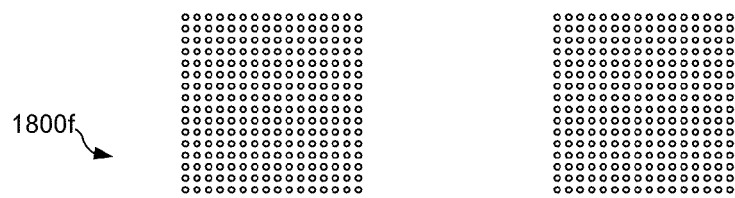
FIG. 18J

LASER LIFT OFF SYSTEMS AND METHODS

CROSS-REFERENCE TO RELATED APPLICATION

The present application claims the benefit of U.S. Provisional Patent Application Ser. No. 61/267,194 filed Dec. 7, 2009, which is incorporated herein by reference.

TECHNICAL FIELD

The present invention relates to separation of layers of material and more particularly, to a laser lift off systems and methods for monolithic separation of layers of material, such as a substrate and a film grown on the substrate.

BACKGROUND INFORMATION

Laser lift off may be used to separate layers of material. One application in which laser lift off has been used advantageously is the separation of GaN layers from sapphire substrates when manufacturing light emitting diodes (LEDs). In spite of the advantages from UV-laser lift-off, GaN LED manufacturing has been limited due to poor productivity caused by low process yield. The low yield is due in part to high residual stresses in a GaN-sapphire wafer, resulting from a Metal-Organic Chemical Vapor Deposit (MOCVD) process. The MOCVD process requires an activation temperature of over 600° C. As shown in FIG. 1A, GaN and InGaN layers 32 are deposited on a sapphire wafer 38 by the MOCVD process. Since there is substantial difference in coefficients of thermal expansion (CTE) between the GaN ($5.59 \times 10{-}6/°$ K) and the sapphire ($7.50 \times 10{-}6/°$ K) (see Table 1), high levels of residual stresses exist when the GaN/sapphire wafer cools down to ambient temperature from the high temperature of the MOCVD process, as shown in FIG. 1B. The residual stresses include compressive residual stresses 40 on the GaN and tensional residual stresses 42 on the sapphire.

TABLE 1

Various material properties of GaN and sapphire.

| Material | Structure | Lattice Const. a (Å) | Lattice Const. c (Å) | Density (g/cm$^3$) | Band Gap Energy (eV) | Thermal Expansion $\times 10^{-6}/°$ K |
|---|---|---|---|---|---|---|
| Sapphire | Hexagonal | 4.758 | 12.991 | 3.97 | 9.9 | 7.50 |
| GaN | Hexagonal | 3.189 | 5.815 | 6.1 | 3.3 | 5.59 |

When an incident laser pulse with sufficient energy hits a GaN/sapphire interface, the irradiation results in instantaneous debonding of the interface. Since the incident laser pulse has limited size (usually far less than 1 cm$^2$), it creates only a small portion of the debonded or lifted-off interface. Since surroundings of the debonded area still have a high level of residual stress, it creates a concentration of stress at the bonded/debonded border, resulting in fractures at the border. This fracturing, associated with the residual stress, has been one of the obstacles of the UV-laser lift-off process.

Currently, there are different ways to perform laser lift-off processes on GaN/sapphire wafers. One method involves raster scanning of a Q-switched 355 nm Nd:YAG laser (see, e.g., M. K. Kelly, R. P. Vaudo, V. M. Phanse, L. Gorgens, O. Ambacher and M. Stutzmann, Japanese Journal of Applied Physics, vol. 38 p. L217, 1999). This lift-off process using a solid state laser is illustrated in FIG. 2A. Another method uses a 248 nm excimer laser (see, e.g., W. S. Wong, T. Sands, N. W. Cheung, M. Kneissl, D. P. Bour, P. Mei, L. T. Romano and N. M. Johnson, Applied Physics Letters, vol. 75 p. 1360, 1999). This lift-off process using an excimer laser is illustrated in FIG. 2B.

Both processes employ raster scanning, as shown in FIG. 3, which involves either translation of the laser beam 44 or the target of the GaN/sapphire wafer 46. A problem associated with the raster scanning method is that it requires overlapping exposures to cover the desired area, resulting in multiple exposures 48 for certain locations. In both of the above methods, the laser lift-off of GaN/sapphire is a single pulse process. The unnecessary multiple exposures in localized areas increase the potential for fracturing by inducing excessive stresses on the film.

As shown in FIG. 4, raster scanning also involves a scanning of the laser beam 44 from one end to the other, gradually separating the GaN/sapphire interface from one side to the other. This side-to-side relaxation of residual stresses causes large differences in the stress level at the interface 50 between the separated and un-separated regions, i.e., the interface between the scanned and the un-scanned area. The disparity in residual stress levels at the interface 50 increases the probability of propagation of Mode I and Mode II cracks. Although the illustrations in FIGS. 3 and 4 are based on a process using a solid state laser, raster scanning of an excimer laser will produce similar results.

Currently, a common size of sapphire wafers is two-inch diameter, but other sizes (e.g., three-inch and four-inch wafers) are also available for the hetero-epitaxial growth of GaN. For a GaN/sapphire wafer, the level of residual stresses varies in the wafer, and compressive and tensile residual stresses may exist together. The existence of the residual stresses may be observed by wafer warping or bowing. When a laser lift-off process relaxes a large area of a continuous GaN/sapphire interface, as described above, a severe strain gradient may be developed at the border between the debonded and the bonded interface. This strain gradient may cause extensive fracturing of the GaN layer.

When a target material is irradiated with an intense laser pulse, a shallow layer of the target material may be instantaneously vaporized into the high temperature and high pressure surface plasma. This phenomenon is called ablation. The plasma created by the ablation subsequently expands to surroundings. The expansion of the surface plasma may induce shock waves, which transfer impulses to the target material. The ablation may be confined in between two materials when the laser is directed through a transparent material placed over the target. During this confined ablation, the plasma trapped at the interface may create a larger magnitude of shock waves, enhancing impact pressures. The explosive shock waves from the confined ablation at the GaN/sapphire interface can cause not only separation of the GaN layer from the sapphire substrate but may also fracture the GaN layer near the laser beam spot (see, e.g., P. Peyre et. al., Journal of Laser Applications, vol. 8 pp. 135-141, 1996).

Another technique for laser lift off involves the use of near-field imaging techniques to image a beam spot at the interface between the layers being separated. FIG. 5 illustrates one example of a projection of a homogeneous beam by near-field imaging and shows a representative beam profile along the beam path. The raw beam from an excimer laser 120 has Gaussian distribution in short side and flat topped distribution in the long side. The beam homogenizer 122 (e.g., of multi-array configuration) makes the gradient raw beam profile into a square flat-topped profile. The homogenized beam is cropped by the mask 124 (e.g., the rectangular variable aperture) to utilize the best portion of the beam, which is projected to the LED target wafer 116 by near-field imaging, for example, using beam imaging lens 126. The edge resolution of the homogeneous beam spot 130 at the LED wafer 116 therefore becomes sharp.

FIGS. 6-8C illustrate one way in which the imaged beam (e.g., the beam spot 130) can cause separation of layers of material of the LED wafer 116. Referring to FIG. 6, the laser may be directed through at least one layer of substrate material 102 (e.g., sapphire) to at least one target material 104 (e.g., GaN) to separate the materials 102, 104. The separation of the materials 102, 104 may be achieved by using a laser energy density sufficient to induce a shock wave at the interface 106 of the target material 104 and the substrate material 102, thereby instantaneously debonding the target material 104 from the substrate material 102. The shock wave may be created by the explosive expansion of plasma 108 at the interface as a result of the increased density of the ionized vapor sharply elevating the plasma temperature. The laser energy density may be in a range sufficient to induce a force $F_a$ on the target material 104 that causes separation without fracturing. The applied force $F_a$ may be represented as follows:

$$P_p(GPa) = C[I_r(GW/cm^2)]^{1/2}$$

$$F_a(N) = P_p(GPa) A_r(cm^2)$$

where $P_p$ is the peak pressure induced by explosive shock waves, C is an efficiency and geometrical factor, $I_r$ is the irradiance of the incident laser beam, $F_a$ is the applied force and $A_r$ is the area under irradiation.

When the plasma 108 is expanding, as shown in FIG. 7, the irradiation zone is acting as a bending arm pivoting at the edge of the irradiation zone. For example, the force ($F_r$) required for rupturing or fracturing may be viewed as a two-point bend test and may be represented as follows:

$$F_r \propto \frac{wd^2}{L}\sigma_r$$

where d is the thickness of the target material 104, w is the width of the applied force or width of the laser pulse, L is the length of applied arm or half length of the laser pulse, and $\sigma_r$ is the modulus of rupture or fracture stress of GaN. To increase the force ($F_r$), the width w of the laser pulse may be increased and the half length L of the laser pulse may be decreased, thereby forming a line shaped beam. The line shaped beam may be scanned across the target material 104 to minimize the bending moment upon irradiation.

At a laser energy density under the ablation threshold of GaN (~0.3 J/cm² at 248 nm), for example, the instantaneous separation of the GaN/sapphire interface 106 may not be successfully achieved, as shown in FIG. 8A. Although decomposition of the GaN can occur under the ablation threshold, this alone cannot achieve instantaneous separation of the interface 106, because there is no driving force, i.e. shock waves from the expanding plasma, without the ablation. Conversely, applying overly-intense laser energy density may create excessive explosive stress wave propagation, which results in cracks and fractures on the target material 104 (e.g., the GaN film), as shown in FIG. 8C. When the irradiating laser energy density is optimized, as shown in FIG. 8B, the force created by the shock wave is sufficient to separate the layers 102, 104 at the interface 106 but not enough to induce fracture in the target material 104. According to this example with GaN and sapphire, the laser energy density may be between about 0.60 J/cm² to 1.5 J/cm² to achieve the separation shown in FIG. 8B.

The near-field imaging techniques described above have been used successfully in a process known as patterned laser lift off to overcome many of the problems associated with residual stress and other problems discussed above. The patterned laser lift off technique forms streets in one or more layers to be separated, forms a beam spot to cover one or more of the sections defined by the streets, and separates layers in the sections. One example of a patterned lift off method is described in greater detail in U.S. Pat. No. 7,202,141, which is fully incorporated herein by reference. Although successful, the patterned lift off technique requires the additional steps of forming the streets, which results in a more time-consuming process. Attempts at using the techniques described above to provide monolithic laser lift off, however, have been less successful because of the problems associated with residual stress.

BRIEF DESCRIPTION OF THE DRAWINGS

These and other features and advantages will be better understood by reading the following detailed description, taken together with the drawings wherein:

FIG. 1A is a schematic diagram illustrating a GaN/sapphire wafer during a MOCVD process.

FIG. 1B is a schematic diagram illustrating formation of residual stresses on a GaN/sapphire wafer after a MOCVD process.

FIG. 2A is a schematic diagram illustrating a conventional method of laser lift-off on a GaN/sapphire wafer using a Q-switched 355 nm Nd:YAG laser.

FIG. 2B is a schematic diagram illustrating a conventional method of laser lift-off on a GaN/sapphire wafer using a 248 nm excimer laser.

FIG. 7 is a schematic diagram illustrating an irradiation zone and cross-section of the separation of the layers.

FIGS. 8A-8C are schematic diagrams illustrating the effects of different laser energy densities on the separation of layers.

FIG. 11 is a schematic perspective view of a laser lift off system including a diffractive optical element (DOE) forming a pattern of non-contiguous laser beam spots capable of irradiating a corresponding pattern of simultaneous non-contiguous irradiation zones.

FIGS. 12A and 12B are schematic perspective views of a mask forming a pattern of non-contiguous laser beam spots capable of irradiating a corresponding pattern of simultaneous non-contiguous irradiation zones, consistent with different embodiments.

FIGS. 15A-15G are schematic illustrations of irradiation patterns formed by non-contiguous laser beam spots and lift off patterns formed by scanning the irradiation patterns for sequential irradiations with different degrees of negative overlap.

FIGS. 16A-16E are schematic illustrations of irradiation patterns formed by non-contiguous laser beam spots and lift off patterns formed by scanning the irradiation patterns for sequential irradiations with zero overlap and with positive overlap.

FIGS. 18G-18I are schematic illustrations of irradiation patterns formed by narrow line-shaped beam spots.

FIG. 18J is a schematic illustration of an irradiation pattern formed by multiple matrices of small beam spots.

DETAILED DESCRIPTION

Laser lift off systems and methods, consistent with the embodiments described herein, may be used to provide monolithic laser lift off with minimal cracking by reducing the size of one or more beam spots in one or more dimensions to reduce plume pressure while maintaining sufficient energy to provide separation. By irradiating irradiation zones with various shapes and in various patterns, the laser lift off systems and methods use laser energy more efficiently, reduce cracking when separating layers, and improve productivity.

Some laser lift off systems and methods described herein separate layers of material by irradiating non-contiguous irradiation zones with laser lift off zones (LOZs) that extend beyond the irradiation zones. Other laser lift off systems and methods described herein separate layers of material by shaping the irradiation zones and/or by controlling the overlap of the irradiation zones in a way that avoids uneven exposure of the workpiece. Consistent with at least one embodiment, a laser lift off system and method may be used to provide monolithic lift off of one or more epitaxial layers on a substrate of a semiconductor wafer.

According to some exemplary embodiments, the laser lift off systems and methods described herein are used to lift off or separate a GaN epi layer from a sapphire substrate of a semiconductor wafer; although other types of substrates and layers of material may be used which are known to those skilled in the art. Also, a sacrificial layer can be provided between the GaN (or other layer of material) and the sapphire (or other type of substrate). Any of the lift off systems and methods described herein can be applied to any highly absorbing material on a transparent carrier including, without limitation, a polymer material such as polyamide on transparent glass.

Figure 4:
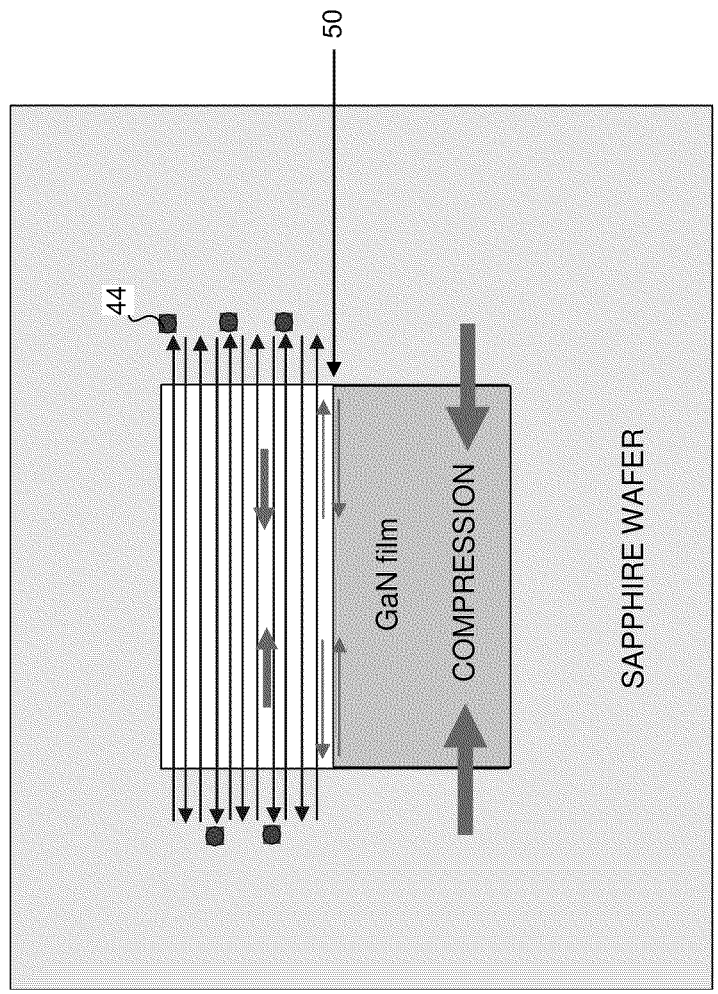
FIG. 4 is a schematic diagram illustrating raster scanning on a GaN/sapphire LED wafer and the resulting stresses, which create a high probability of Mode I and II cracks at the interface.
Figure 3:
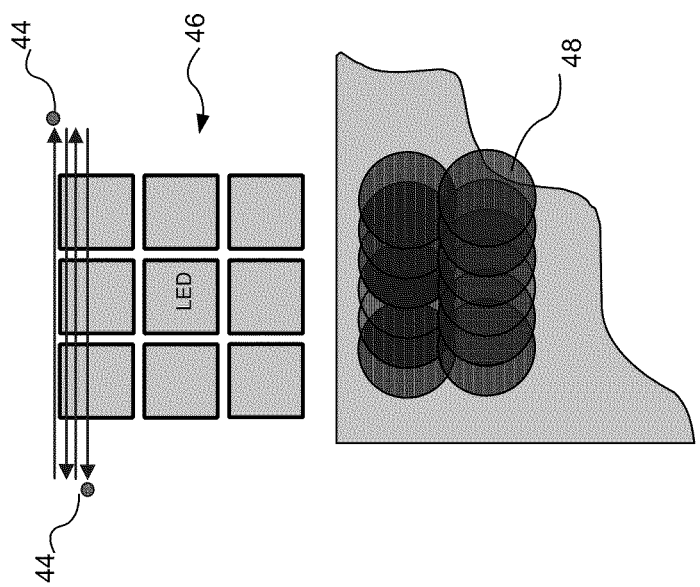
FIG. 3 is a schematic diagram illustrating raster scanning of a Q-switched 355 nm Nd:YAG laser on a GaN/sapphire LED wafer and the resulting multiple exposures.
Figure 5:
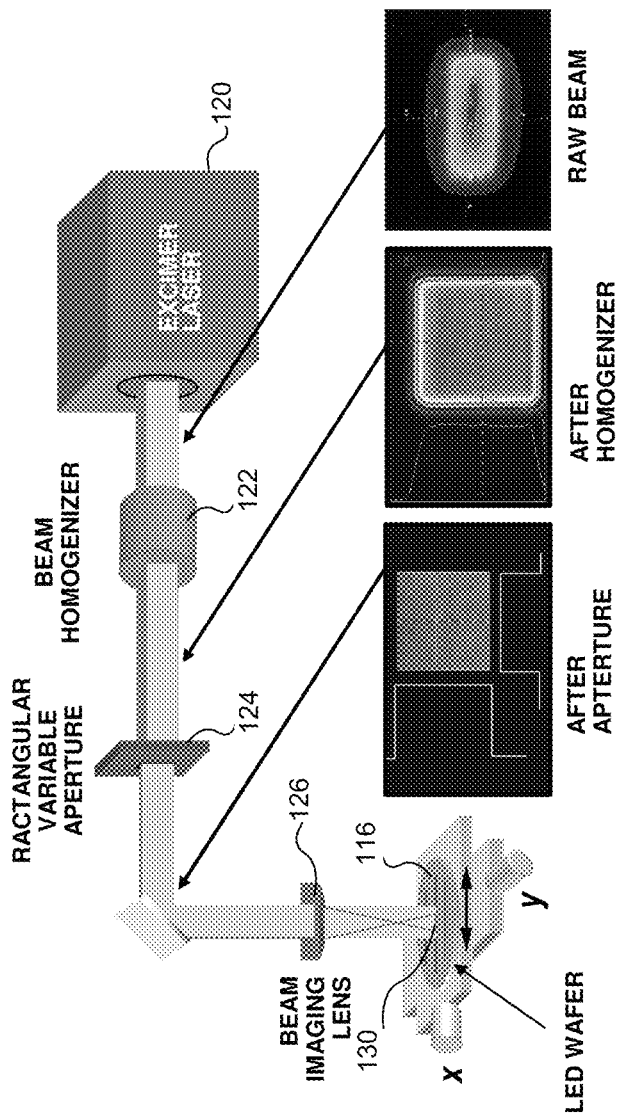
FIG. 5 is a schematic diagram of a laser lift off system that uses near-field imaging to form a beam spot.
Figure 6:
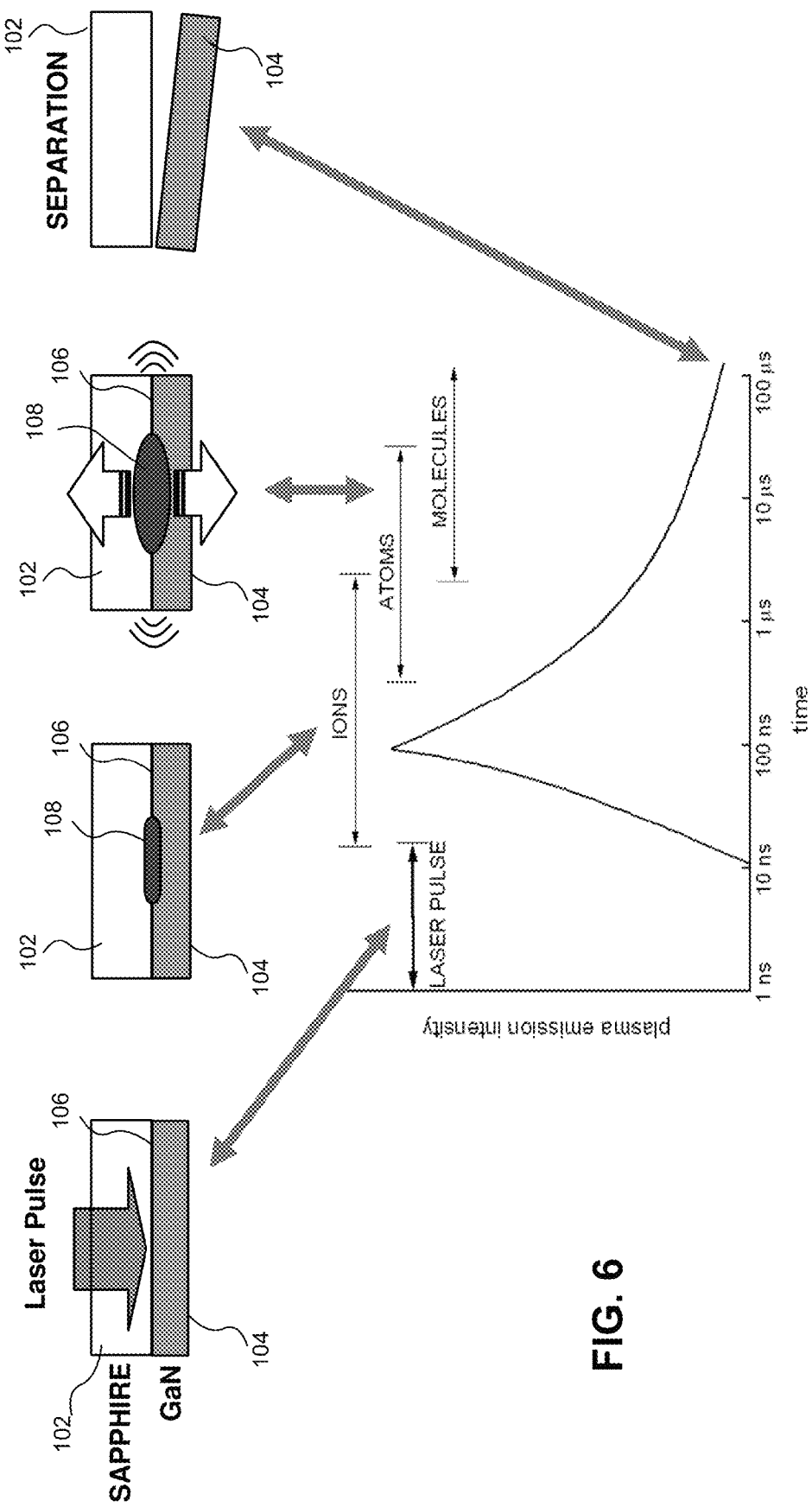
FIG. 6 is a schematic diagram of the use of a laser pulse to induce a shock wave for separating layers.
Figure 9A:
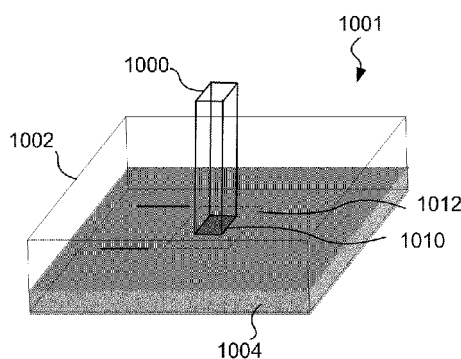
FIGS. 9A and 9B are schematic perspective and side views, respectively, of a reduced size beam spot irradiating layers of material with an irradiation zone formed at the interface and a lift off zone (LOZ) extending around the irradiation zone.
Figure 9B:
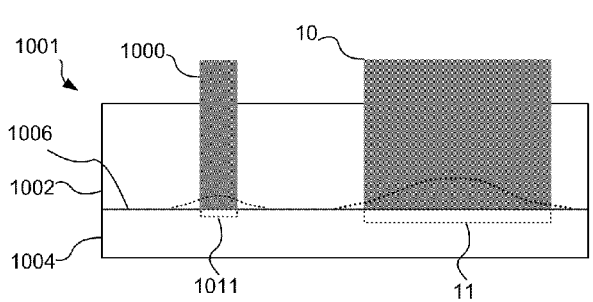

Referring to FIGS. 9A and 9B, a laser beam 1000 is used to separate one or more layers 1002, 1004 of material of a workpiece 1001. The laser beam 1000 passes through at least one layer 1002 to irradiate an interface 1006 with at least one other layer 1004 to be separated or lifted off. As used herein, "irradiate" refers to exposing an area with a single pulse of laser radiation. A beam spot formed by the laser beam 1000 at the interface 1006 irradiates an exposed laser irradiation zone 1010 and causes separation of the layers 1002, 1004 in a lift off zone (LOZ) 1012, which may extend beyond the irradiation zone 1010. The refractive index of the layer 1002 (e.g., the sapphire) through which the laser beam 1000 passes may also cause the laser light to bend inside (not shown) to create smaller irradiated beam spot on the layer 1004 as compared to the beam 1000 or beam spot as seen on a surface of the layer 1002. This smaller beam spot size on the layer 1004 may be taken into consideration when determining the spot size, spot spacing, and process parameters using the lift off methods described below to avoid cracking while allowing monolithic lift off.

The energy of a laser pulse causes ablation of the material in one of the layers 1002, 1004 primarily in the irradiation zone 1010 where the pulse energy is absorbed. This ablation results in an instantaneous debonding and separation of the layers 1002, 1004. Because thermal energy may be conducted beyond the irradiation zone 1010, ablation and/or decomposition may occur beyond the irradiation zone 1010 and may result in separation of the layers 1002, 1004 beyond the irradiation zone 1010 (i.e., creating the LOZ 1012). The ablation of material at the interface 1006 also generates a plasma plume that expands and creates a pressure (referred to as plume pressure) between the layers 1002, 1004, which may also extend the lift off zone 1012.

As mentioned above, when the plume pressure is too high, the resulting force may cause cracking in one or more of the layers 1002, 1004 being separated. Consistent with the lift off systems and methods described herein, laser irradiation parameters such as laser wavelength, pulse width, energy density, beam spot size, beam spot shape, and beam spot array patterns may be configured to provide adequate separation of the layers 1002, 1004 while minimizing plume pressure to minimize cracking. Consistent with at least some embodiments, the laser irradiation parameters may be configured to provide monolithic lift off of a GaN layer on a substrate of a semiconductor wafer with minimal or no cracking.

The plume pressure is a function of the volume of material that is ablated per pulse at the interface 1006 (also referred to as the interaction volume), which relates to the area of the irradiation zone 1010 and the ablation depth. Higher ablation rates, for example, may remove a larger volume of material and create higher plume pressures. One way to reduce the interaction volume is by reducing the size of the laser beam 1000 and thus the size of the beam spot. When reducing the spot size reduces the pulse energy applied to the irradiation zone 1010, the ablation depth may be reduced in addition to the area. As shown in FIG. 9B, for example, the laser beam 1000 is smaller than the laser beam 10 and forms a beam spot (and irradiation zone) having a smaller area and lower pulse energy. As a result of the smaller area of the irradiation zone and the lower pulse energy reducing the ablation depth, the volume of material 1011 ablated by a pulse of the smaller beam 1000 is smaller than a volume of material 11 ablated by a pulse of the larger beam 10.

Thus, the beam may be adjusted to reduce the beam spot size to match an allowable stress level for the materials 1002, 1004 being separated. Various sizes of beam spots may be used depending upon, for example, the type of material, the thickness of the layers, and the area to be separated. Examples of smaller beam spots that have been found capable of monolithic lift off of epi layers from sapphire substrates include 100 by 100 micron square beams and 200 by 200 micron square beams. As described in greater detail below, the number of beam spots with reduced size on target may be extended to achieve a higher throughput and various spacings may be used between irradiations (e.g., positive, negative or zero overlapping) to allow separation while minimize cracking. The spacings or overlapping may also be different in different axes or scan direction, for example, depending upon beam divergence in the axes and/or the internal stresses along the axes. A beam passing through a homogenizer, for example, may have an asymmetrical point spread function such that the beam profile is sharper along its Y axis than along its X axis. Such a beam may have positive overlap along the X axis and zero or negative overlap along the Y axis.

Another way to change the interaction volume is by using different wavelengths and/or pulse durations or widths. Depending upon the material characteristics, the ablation depth may be related to optical penetration depth and/or thermal penetration depth. Changing the wavelength may impact optical penetration depth and changing the pulse width may impact both optical penetration depth and thermal penetration depth. Shorter wavelengths having a higher photonic energy, for example, may provide better absorption and shallower optical penetration depth for certain materials such as GaN. Shorter pulse widths reduce diffusion effects because the pulse may be delivered in a shorter time than the time it takes to conduct heat into the material and thus reduce thermal penetration depth. Shorter pulse widths may also increase non linear effects resulting in higher absorption and reduced optical penetration in certain cases. Depending upon the materials, for example, a nanosecond excimer laser at 248 nm or 193 nm or an ultrashort laser (with pulse durations less than 1 ns) may be used to provide a desired ablation depth.

A further way to change the interaction volume is by adjusting the energy density of the beam spot that irradiates the irradiation zone 1010. Ablation occurs when the energy density is above an ablation threshold for a particular material and wavelength. As the energy density increases, the absorption depth increases resulting in a larger interaction volume. In general, energy density is energy over area and may be controlled by changing either the energy or the area of the beam. For example, energy density may be controlled by controlling the power to the laser, by using attenuators, or by shaping (e.g., expanding or contracting) the beam using beam shaping optics, as will be described in greater detail below. Thus, the energy density of the beam spot on the workpiece may be varied to optimize the fluence and coupling efficiency for a particular material, to provide a desired ablation depth, and/or to control the amount of heat in the layer being lifted off.

The laser irradiation parameters, such as the wavelength, pulse width, and energy density, depend on the types of materials being separated. For example, a laser wavelength of 248 nm is suitable for separating GaN from sapphire because the photonic energy of 248 nm (5 eV) is between the bandgaps of GaN (3.4 eV) and sapphire (9.9 eV). Thus, the 248 nm radiation is better absorbed in GaN than in sapphire and the selective absorption allows the laser radiation to pass through the sapphire to ablate the GaN resulting in separation. At a wavelength of 248 nm, the ablation threshold of GaN is about 0.3 $J/cm^2$.

Those skilled in the art will recognize that other laser wavelengths may be used to separate other types of materials. For example, a buffer layer may be used between the sapphire substrate and the GaN layer(s) to facilitate epitaxial growth of the GaN. Examples of the buffer layer include a GaN buffer layer and an Aluminum Nitride (AlN) buffer layer. Where an AlN buffer layer is used, a laser at 193 nm may be used because the photonic energy of the 193 nm laser light (6.4 eV) is in between bandgaps of sapphire (9.9 eV) and AlN (6.1 eV).

Referring to FIGS. 10A-10E, one or more reduced size beam spots may be used to irradiate multiple irradiation zones 1010a-d with various spacings between the irradiation zones to allow monolithic separation of the layers of the workpiece while minimizing cracking. FIGS. 10A-D show irradiation zones 1010a-d formed by sequential irradiations using a single beam spot with varying degrees of overlap as the beam spot moves stepwise across the workpiece. Four irradiation zones 1010a-d are shown for purposes of illustration, but multiple irradiation zones may be sequentially formed across an entire workpiece to separate the layers of the workpiece. To move the beam spot stepwise across the workpiece, the beam may be moved relative to the workpiece or the workpiece may be moved relative to the beam, as will be described in greater detail below. The beam spot may also be moved in different directions or patterns other than a stepwise direction across a workpiece, as will be described in greater detail below.

Figure 10A:
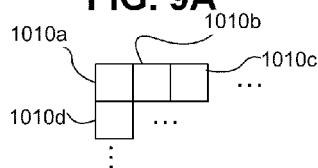
FIGS. 10A-10D show a reduced size beam spot being scanned with varying degrees of overlap, consistent with various embodiments.

As shown in FIG. 10A, for example, the irradiation zones 1010a-d may have zero overlap (i.e., each step is substantially the same as the width of the beam spot). In other words, each location along the interface between the layers is exposed to a single shot or pulse of laser radiation. In one example where an epitaxial layer is separated from a sapphire substrate, a single beam spot with a spot size of about 227 microns by 213 microns at 1 $J/cm^2$ may be used with zero overlapping and when applied with a pulse frequency of about 400 Hz may be capable of lifting off a 2 inch wafer in about 3 minutes.

Figure 10B:
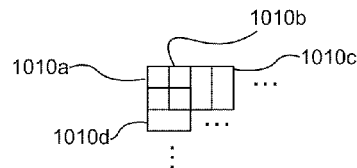
Figure 10D:
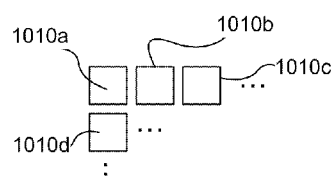
Figure 10C:
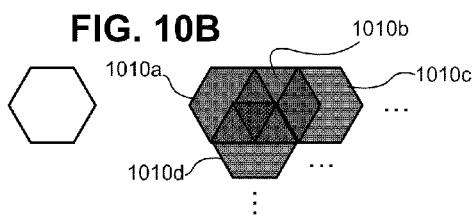

As shown in FIGS. 10B and 10C, the irradiation zones 1010a-d may have positive overlap such that each location along the interface between the layers is exposed to multiple shots or pulses of laser irradiation. In one embodiment, the positive overlap is controlled such that each location is exposed to the same number of pulses to avoid uneven exposures across the workpiece. As shown in FIG. 10B, a square shaped beam spot may be overlapped by using a step size about ½ the width of the beam spot such that each location is exposed to four (4) shots or pulses of laser irradiation. Beams spots with other shapes may also be used to control the overlap. As shown in FIG. 10C, for example, a hexagonal shaped beam spot may be overlapped by using a step size about ½ the width of the beam spot such that each location is exposed to three (3) shots or pulses of laser irradiation. The energy density may be set (e.g., at about the ablation threshold) such that the multiple pulses will result in separation without causing cracking.

In other embodiments, the irradiation zones may have a gradually decreasing energy density at the edges and may overlap only at the edges such that the combined energy density of the overlapping portions is optimized for separation without cracking. In these embodiments, a gradient mask may be used to form the beam spots with the decreasing energy density at the edges.

In other embodiments, a narrow line shaped beam may be scanned across a portion of a workpiece or across an entire workpiece with zero or relatively small positive overlapping. Such a narrow line beam may perform lift off without being homogeneous across the width of the narrow line beam. In one example, a narrow line beam may have a length of about 52 mm and a width of about 20 microns and may be applied with an energy density of about 1 J/cm$^2$. Using such a narrow line beam generated by an excimer laser with a pulse frequency of 400 Hz may allow speeds of 8 mm/sec and separation of an epi layer from a wafer in about 10 sec. A line beam with a more narrow width may also be used.

As shown in FIG. 10D, the irradiation zones 1010a-d may be non-contiguous or spaced with a negative overlap (i.e., the step size is greater than the width of the beam spot). As used herein, "non-contiguous" refers to zones that do not overlap or touch. In this embodiment, the beam spot may have a size and/or shape such that the lift off zone extends beyond the irradiation zone. Thus, the adjacent non-contiguous irradiation zones 1010a-d may be separated by a spacing that is as wide as possible while still resulting in separation of the layers. The pitch or separation may depend upon the type of material being separated, the size of the lift off zone relative to the irradiation zone, and other laser processing parameters. In one example where an epitaxial layer is separated from a sapphire substrate, a single reduced size beam spot (e.g., about 200 by 200 microns) may be smaller than the step size or pitch by about 3 microns.

Although FIGS. 10A-10D show a single beam spot performing sequential irradiations across a workpiece, an array or pattern of multiple reduced size beam spots may also be formed to perform simultaneous irradiations. The reduced size beam spots within an array or pattern may have varying degrees of spacing or pitch. The array or pattern of beam spots may also be used to provide sequential irradiations with varying degrees of overlap similar to a single beam spot (i.e., zero overlap, positive overlap, or negative overlap). Although FIGS. 10A-10D show sequential irradiations of either zero overlap, positive overlap, or negative overlap, various combinations of these overlaps may be used in different axes or scan directions.

Figure 10E:
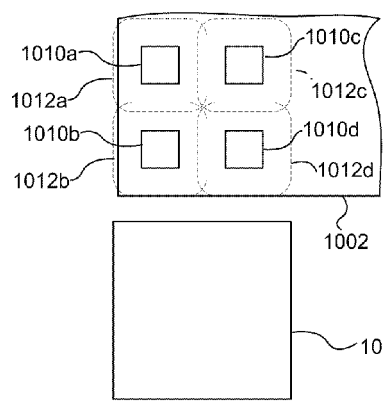
FIGS. 10E and 10F are a schematic plan and side views, respectively, of laser beams forming laser beam spots that irradiate non-contiguous irradiation zones.
Figure 10F:
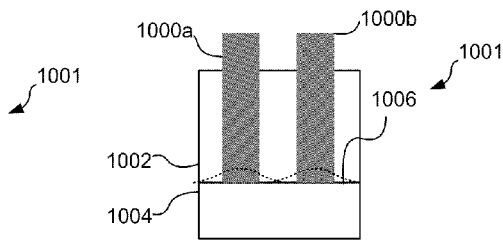

As shown in FIGS. 10E and 10F, for example, multiple beams or beamlets 1000a-d may form an array of reduced size beam spots that irradiate multiple non-contiguous irradiation zones 1010a-d simultaneously. In one embodiment, the array of beam spots may have a shape and size such that the lift off zones 1012a-d extend beyond the respective irradiation zones 1010a-d and the layers 1002, 1004 may be separated without overlapping the irradiation zones 1010a-d, thereby avoiding cracking due to multiple exposures. Where an array of non-contiguous irradiation zones 1010a-d have larger lift off zones 1012a-d, for example, the aggregate lift off zone may be equivalent to one larger laser beam spot 10.

As discussed above, the plume pressure is reduced by using the smaller beam size and/or by otherwise reducing the interaction volume. A plurality of non-contiguous irradiation zones 1010a-d may be irradiated with a plume pressure that is less than the plume pressure of the equivalent larger beam spot 10 because the lift off zones 1012a-d allow less energy to be spread over the same area with a smaller interaction volume. Forming arrays of non-contiguous irradiation zones 1010a-d may thus allow a larger aggregate lift off zone with less energy. The size and spacing of the beam spots may depend on the amount of energy density that is desired to provide separation with minimal pressure and stress.

Using a pattern of beam spots that simultaneously irradiate a corresponding pattern of non-contiguous irradiation zones 1010a-d increases the aggregate lift off zone of each irradiation and increases the lift off speed in addition to lowering the plume pressure and stress on the layers. Although FIGS. 10E and 10F shown non-contiguous irradiation zones with larger lift off zones, an array or pattern of beam spots may also irradiate non-contiguous irradiation zones with lift off zones substantially the same as the irradiation zones. Various shapes and patterns for beam spots and irradiation zones are described in greater detail below.

The laser beams 1000a-d and/or the workpiece 1001 may be moved such that the array of beam spots may perform irradiations in different locations around the workpiece 1001 to separate the layers 1002, 1004. The array or pattern of beam spots may be scanned or moved, for example, in a stepwise direction with varying degrees of overlapping irradiations similar to the single beam spot described above. Various scanning strategies may be used across the workpiece 1001 to minimize the stresses that occur as a result of the separation processes (e.g., leaving some rows or areas unprocessed and then filling in those unprocessed areas). Various patterns and scanning techniques are shown and described in greater detail below.

Figure 13:
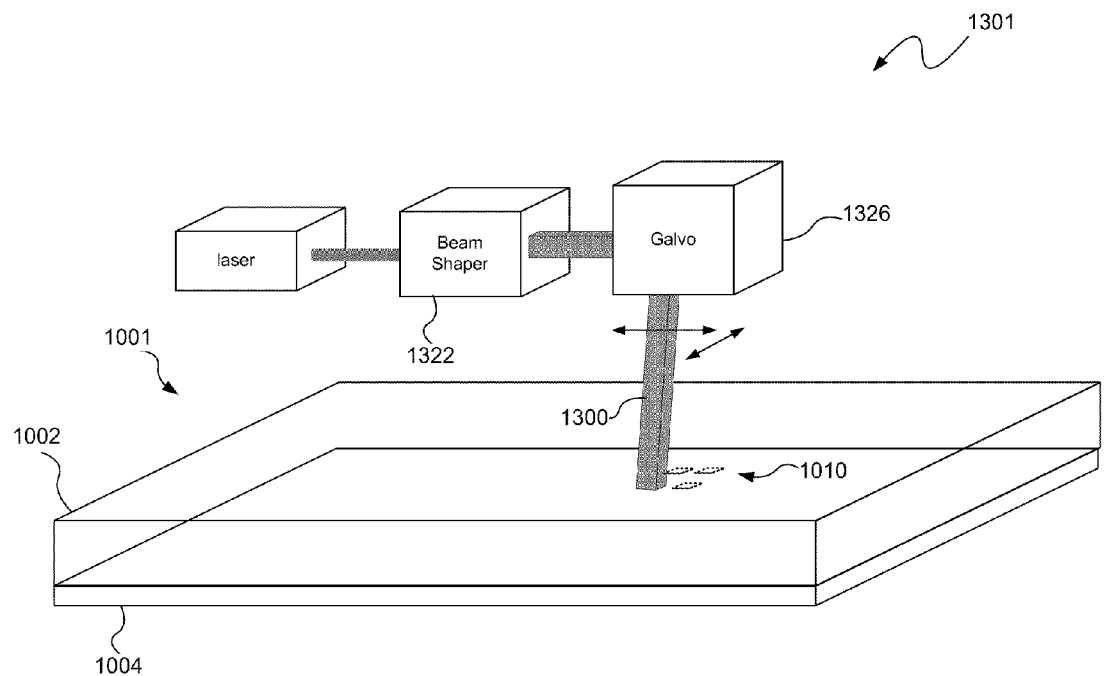
FIG. 13 is a schematic perspective view of a laser lift off system including a galvanometer capable of moving one or more laser beams to irradiate a pattern of non-contiguous irradiation zones.

Embodiments of laser lift off systems are shown in FIGS. 11-13. In general, the laser lift off systems include a laser for generating a raw laser beam and a beam delivery system for modifying the beam and delivering the modified beam (or beamlets) to the workpiece 1001. As shown in FIG. 11, a laser lift off system 1101 may include a laser 1120 for generating a raw laser beam 1121, a beam shaper 1122 for producing a shaped laser beam 1123, and a diffractive optical element 1124 for forming multiple shaped beamlets 1100a-d. The beam delivery system of the laser lift off system 1101 may also include one or more reflective elements 1126 for reflecting the laser beams.

The laser 1120 may include, without limitation, an excimer laser, a diode pumped solid state (DPSS) laser, a fiber laser, or an ultrafast laser at the desired wavelength. An ultrafast laser is generally a laser capable of emitting ultrashort pulses having pulse durations less than 1 nanosecond, i.e., pulses with durations of femtoseconds or picoseconds. An ultrafast laser may be capable of producing the laser beam 1000 at different wavelengths (e.g., about 0.35 µm, 0.5 µm or 1 µm or any increments therebetween) and at different ultrashort pulse widths (e.g., less than about 10 ps). Using an ultrafast laser capable of changing the wavelength and/or pulse width allows control over the ablation depth and interaction volume as described above. One example of an ultrafast laser is a Trumicro series 5000 picosecond laser available from TRUMPF.

The beam shaper 1122 may include, for example, a mask with an aperture that produces the desired beam shape of the shaped laser beam 1123 when the raw laser beam 1121 passes through the aperture. The beam shaper 1122 may also include beam shaping optics (e.g., lenses) that change the shape and/or size of the raw beam 1121 before a mask or the shaped beam 1123 after a mask. In one embodiment, the beam shaper 1122 includes beam shaping optics capable of controlling the energy density of the beam spot, for example, as described in greater detail in U.S. Pat. No. 7,388,172, which is fully incorporated herein by reference. The beam shaper 1122 may thus be used to vary the energy density of the beam spot on the workpiece (e.g., to reduce the absorption depth and the interaction volume) without having to adjust the laser power. The beam shaper 1122 may further include beam shaping optics that produce the desired beam shape of the shaped laser beam 1123 without using a mask. Using a beam shaper 1122 (e.g., a mask and/or beam shaping optics) to control the shape and size of the beam spots and the energy density of the beam on the workpiece allows further control over the depth of spreading of the energy and the geometrical spreading of the energy.

The diffractive optical element 1124 may include a holographic optical element (HOE) that uses the principles of diffraction to subdivide the shaped laser beam 1123 into the beamlets 1100a-d. The beamlets 1100a-d form an array of beam spots that simultaneously irradiate a pattern of non-contiguous irradiation zones 1010. The HOE uses substantially all of the energy of the shaped beam 1123 to form the beamlets 1100a-d. When the lift off zones exceed the irradiation zones of the beam spots, the energy of the shaped beam 1123 may be spread over a larger area more efficiently when using the HOE to form a pattern of smaller beamlets, as compared to using a mask to image a single large beam spot. Using the HOE to form an array of smaller beam spots may also avoid the need to homogenize the laser beam with a homogenizer. In one example, the HOE may generate a spot array from a laser beam with an aggregate lift off zone that is greater than 4 times the lift off zone of a single beam spot formed by the same laser beam. One embodiment of a holographic optical element also allows control over the beam spot size and the spacing (or pitch) of the array or pattern of beam spots formed by the HOE.

As shown in FIGS. 12A and 12B, a mask 1128 with an array of apertures may also be used to form an array or pattern of beam spots. One or more laser beams may illuminate the mask 1128 to form the beamlets 1100a-d that pass through the apertures of the mask 1128. The shape, size and spacing of the apertures on the mask 1128 determines the shape, size and spacing of the beam spots produced by the beamlets 1100a-d on the target. In one embodiment shown in FIG. 12A, a single homogenized beam 1123 may be used to illuminate the mask 1128. In another embodiment shown in FIG. 12B, multiple beamlets 1123a-d may be used to illuminate the mask 1128 such that the beamlets 1123a-d provide optimum illumination to match the apertures of the mask 1128, thereby reducing the amount of beam energy that is rejected by the mask 1128 and increasing the beam utilization factor. Other types of spot array generators may also be used to form an array of beam spots.

The laser lift off system 1101 may also include a motion stage 1130 that supports the workpiece 1001 and positions the workpiece 1001 for the sequential irradiations. The motion stage 1130 may be an X-Y and/or theta positioning stage capable of moving the workpiece 1001 in an X-Y direction and/or rotating the workpiece 1001. A motion control system (not shown) may be coupled to the laser 1120 and motion stage 1130 to control the laser irradiations and the positioning of the workpiece 1001, for example, using a "fire on the fly" technique.

The laser lift off system 1101 may also control the manner in which the layers are allowed to detach to minimize cracking. When the substrate 1002 detaches as the lift off progresses across the workpiece 1001, stress is caused because part of the workpiece 1001 is being lifted off while part of the workpiece 1001 is not, which enhances cracking at the lift off front. The laser lift off system 1101 may thus include one or more workpiece holders 1136 (e.g., clamps) for mechanically holding the substrate 1002 down as the lift off process takes place. The edges of the workpiece 1001 may be exposed first, for example, and then the workpiece holders 1136 may hold the edges down while processing the inside region of the workpiece 1001. The workpiece holders 1136 may then slowly release the substrate 1002. Alternatively, another transparent material, such as a thin piece of sapphire, may be used over the workpiece 1001, which allows the laser to pass through to perform the lift off and mechanically prevents bowing as a result of the lift off. By forcing the substrate, the global stresses and related cracking caused by the lift off process may be minimized, thereby improving the yield when manufacturing LEDs.

Figure 13A:
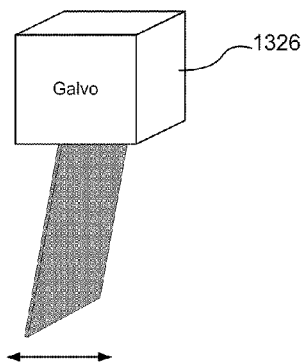
FIG. 13A is a schematic perspective view of a galvanometer scanning a line shaped beam.

According to another embodiment, shown in FIG. 13, a laser machining system 1301 may include a galvanometer 1326 for scanning one or more beam spots on the workpiece 1001 to provide a pattern of non-contiguous irradiation zones 1010. The galvanometer 1326 may be used instead of or in addition to moving the workpiece 1001 with a motion stage. The galvanometer 1326 may be a 1-D or 2-D galvanometer known to those skilled in the art for scanning a laser beam. Using the galvanometer 1326 to scan the beam spot(s) increases the speed at which the beam spot(s) may be moved across the workpiece 1001 and thus increases the lift off speeds. In this embodiment of the laser lift off system 1301, a beam shaper 1322 (e.g., a mask and/or beam shaping optics) may be used before the galvanometer 1326 to provide the desired shape of the beam spot(s) to be scanned across the workpiece 1001 and/or to control the energy density of the beam spot(s). FIG. 13A shows another embodiment in which a galvanometer 1326 scans a line shaped beam.

Figure 14A:
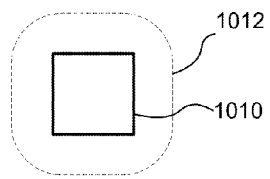
FIGS. 14A-14M are schematic illustrations of laser beam spots having various shapes for irradiating irradiation zones with corresponding LOZs.
Figure 14B:
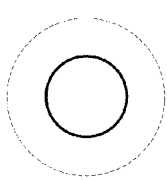
Figure 14C:
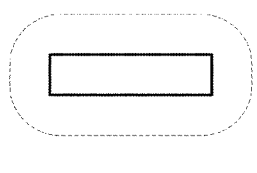
Figure 14D:
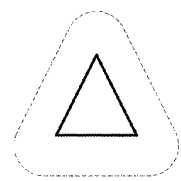
Figure 14E:
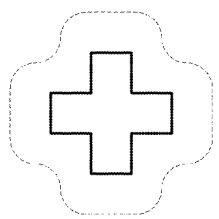
Figure 14F:
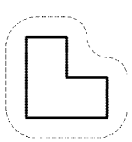
Figure 14G:
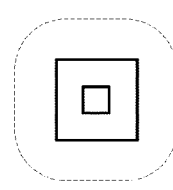
Figure 14H:
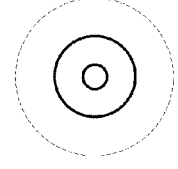
Figure 14I:
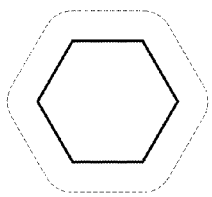
Figure 14J:
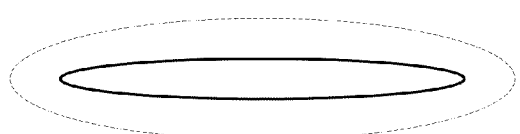
Figure 14K:
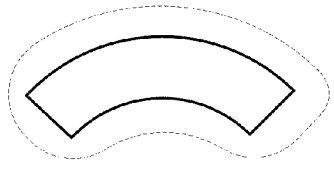
Figure 14L:
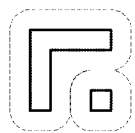

FIGS. 14A-14M show various possible shapes for the beam spots and irradiation zones 1010. Depending upon the size and energy density of the beam spots and the materials being separated, each of the irradiation zones 1010 may have corresponding lift off zones (LOZs) 1012 shown in broken lines. The size and energy density of the beam spots may also be adjusted such that the LOZ 1012 is essentially the same as the irradiation zone 1010. The possible shapes include, but are not limited to, a square (FIG. 14A), circle (FIG. 14B), rectangular line (FIG. 14C), triangle (FIG. 14D), cross (FIG. 14E), L shape (FIG. 14F), hollow square (FIG. 14G), hollow circle (FIG. 14H), hexagon (FIG. 14I), elliptical line (FIG. 14J), and arc (FIG. 14K). For applications where a maximized lift off zone is desired, any shape may be used that provides a lift off zone that is maximized or relatively large compared to the irradiation zone. The beam spots may be formed with the various shapes using a mask and/or beam shaping optics.

Figure 14M:
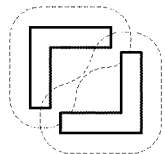

Beam spots may also be formed with combinations of complimentary shapes, such as an L shape together with a square (FIG. 14L) and two L shapes (FIG. 14M). Various combinations of shapes may be formed together, for example, to maximize the aggregate lift off zone formed relative to the corresponding irradiation zones.

Multiple non-contiguous beam spots may be irradiated simultaneously on a workpiece such that the corresponding irradiation zones form an irradiation pattern. The irradiation pattern may be scanned or positioned at various locations across a workpiece by sequentially irradiating the irradiation zones in the irradiation pattern, thereby forming a lift off pattern including multiple sequential irradiation patterns that achieve lift off across the workpiece. Each sequential irradiation may involve a single pulse of laser energy with the irradiation pattern at a different location on the workpiece. The sequential irradiations may have varying degrees of overlap (e.g., zero overlap, positive overlap or negative overlap), which may be different in different axes or scan directions.

FIGS. 15A-15G show various irradiation patterns that may be formed by an array or pattern of non-contiguous beam spots and the various lift off patterns that may be formed by scanning or positioning the irradiation patterns across a workpiece with varying degrees of negative overlap of the irradiation zones. In the irradiation patterns shown in FIGS. 15A-15G, the concept of a lift off zone extending beyond the irradiation zone allows the irradiation patterns to be scanned with negative overlap of the irradiation zones. Although the irradiation patterns are shown with corresponding lift off zones (in broken lines) extending beyond the irradiation zones, the lift off zones may have a different size than shown.

FIG. 15A shows an irradiation pattern 1500$a$ formed by a column of square-shaped non-contiguous beam spots that are spaced such that respective LOZs are touching or overlapping. The aggregate lift off zone formed by the irradiation pattern 1500$a$ thus forms a line. The irradiation pattern 1500$a$ may be scanned across a workpiece with sequential irradiations to form different lift off patterns. The irradiation pattern 1500$a$ may be scanned to provide a lift off pattern 1502$a$ with the lift off zones of the sequential irradiations touching or having minimal overlap. The irradiation pattern 1500$a$ may also be scanned to provide a lift off pattern 1504$a$ with the lift off zones of the sequential irradiations overlapping. The irradiation pattern 1500$a$ may also be scanned to provide a lift off pattern 1506$a$ with the irradiation zones of the sequential irradiations being contiguous.

FIG. 15B shows an irradiation pattern 1500$b$ formed by a column of rectangular-shaped non-contiguous beam spots, which may be scanned across the workpiece similar to the irradiation pattern 1500$a$. This irradiation pattern 1500$b$ may be equivalent to a narrow line beam scanned across a workpiece.

FIG. 15C shows an irradiation pattern 1500$c$ formed by a multiple columns of square-shaped non-contiguous beam spots that are spaced such that respective lift off zones are touching or overlapping. The irradiation pattern 1500$c$ may also be scanned to provide lift off patterns 1502$c$, 1504$c$, 1506$c$ with varying degrees of overlap of the lift off zones of sequential irradiations. Although two columns are shown, the irradiation pattern 1500$c$ may also include more than two columns of square-shaped non-contiguous beam spots.

FIG. 15D shows an irradiation pattern 1500$d$ formed by a multiple staggered columns of square-shaped non-contiguous beam spots that are spaced such that respective lift off zones are touching or overlapping. The irradiation pattern 1500$d$ may also be scanned to provide lift off patterns 1502$d$, 1504$d$, 1506$d$ with varying degrees of overlap of the lift off zones of sequential irradiations.

Figure 15E:
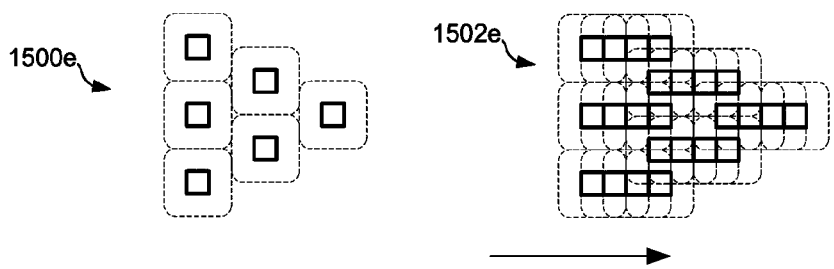

FIG. 15E shows an irradiation pattern 1500$e$ formed by square-shaped non-contiguous beam spots arranged in a triangular pattern and spaced such that respective lift off zones are touching or overlapping. The irradiation pattern 1500$e$ may also be scanned to provide lift off patterns with varying degrees of overlap of the lift off zones of sequential irradiations, such as the lift off pattern 1502$e$.

Figure 15F:
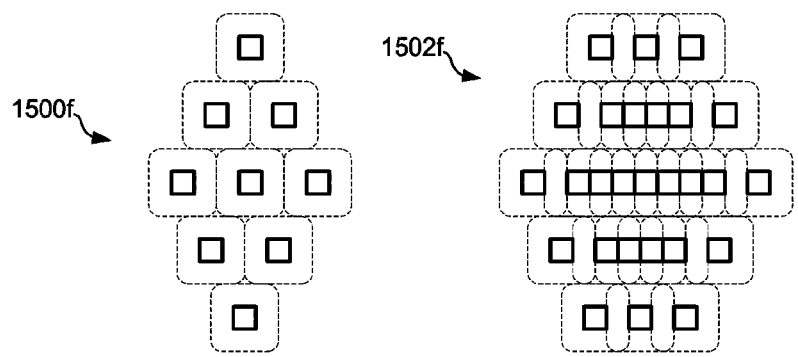

FIG. 15F shows an irradiation pattern 1500$f$ formed by a square-shaped non-contiguous beam spots arranged in a diamond pattern and spaced such that respective LOZs are touching or overlapping. The irradiation pattern 1500$f$ may also be scanned to provide lift off patterns with varying degrees of overlap of the lift off zones of sequential irradiations, such as the lift off pattern 1502$f$. The triangular shaped irradiation pattern 1500$e$ and the diamond shaped irradiation pattern 1500$f$ may reduce point stresses when they are scanned to separate the layers.

Figure 15G:
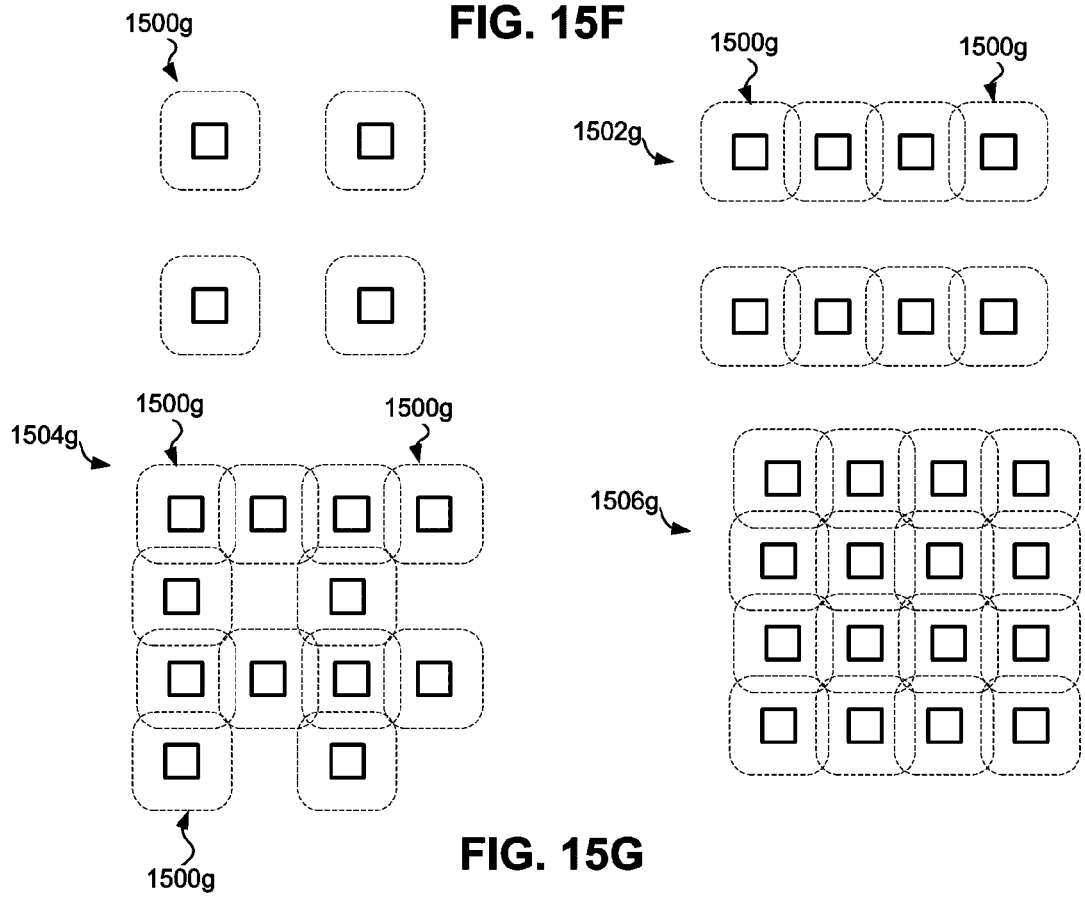

Instead of linearly scanning the irradiation patterns stepwise in one direction across the workpiece, the irradiation patterns may also be positioned in different locations across the workpiece. FIG. 15G shows an irradiation pattern 1500$g$ formed by square-shaped non-contiguous beam spots arranged in an open square pattern. In this irradiation pattern 1500$g$, the beam spots are spaced such that the lift off zones around the irradiation zones are non-contiguous. This irradiation pattern is formed at different locations to interdigitate the sequential irradiations. As shown, the beam spots in this irradiation pattern 1500$g$ are spaced such that multiple passes (i.e., sequential irradiations) are required to fill in an array of irradiation zones. For example, a second pass of the irradiation pattern 1500$g$ forms the pattern 1502$g$, a third pass of the irradiation pattern 1500$g$ forms the pattern 1504$g$, and a fourth pass of the irradiation pattern 1500$g$ forms the complete lift off pattern 1506$g$ that results in separation of the layers. Using this type of interdigitated scanning technique with the irradiation pattern 1500$g$ providing on/off areas of irradiation, the separation of the layers may be performed more gradually across an area of the workpiece, thereby minimizing the stresses caused by releasing the layer from the substrate. In one example, the irradiation pattern 1500$g$ may include an array of 100 micron square beam spots with a center to center spacing of 500 microns.

Figures 1, 16B:
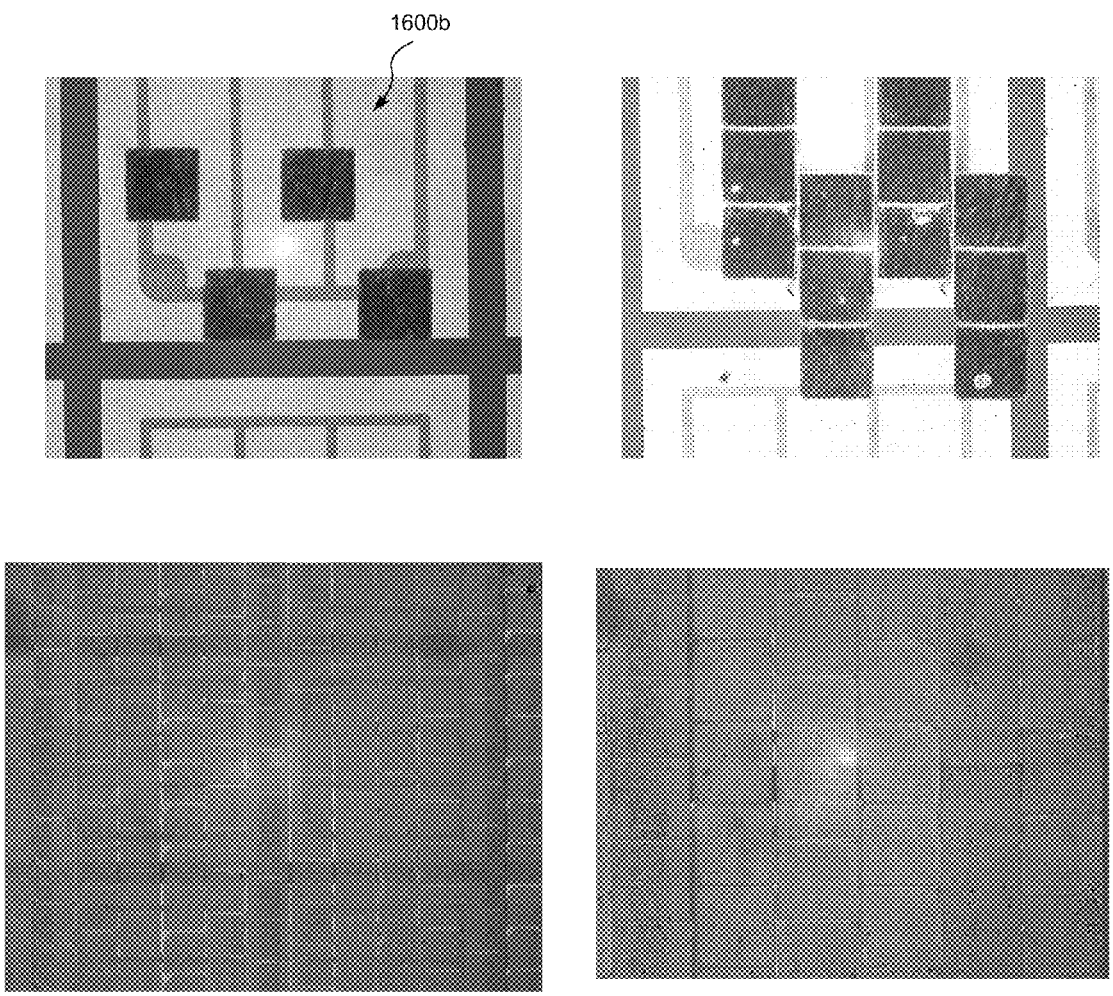

FIGS. 16A and 16B show irradiation patterns that are formed by an array of beam spots that are spaced such that the irradiation patterns may be scanned or overlayed with zero overlap between the irradiation zones. In these irradiation patterns, the lift off zone may not extend beyond the irradiation zones. FIG. 16A shows an irradiation pattern 1600$a$ formed by two square-shaped non-contiguous beam spots that are spaced by about the width of the beam spots (e.g., 200 by 200 microns spaced by 200 microns). The irradiation pattern 1600$a$ may be scanned stepwise with each step being substantially the same as the width of the square beam spot such that the irradiation zones are contiguous in the stepwise direction. A single pass 1601$a$ of the irradiation pattern 1600$a$ forms two rows of sequential irradiation zones that are spaced by a row that is not irradiated or processed. The irradiation pattern 1600$a$ may be scanned with another pass to irradiate or "fill in" the unprocessed row and form a complete lift off pattern 1602$a$ of irradiation zones that causes separation of the layers. Although the irradiation pattern 1600$a$ shown in FIG. 16A is formed by two square-shaped beam spots with a spacing equivalent to one beam spot, similar irradiation patterns may be formed by more than two beam spots with a spacing of one beam spot or a spacing of some multiple of the beam spot.

FIG. 16B shows an irradiation pattern 1600$b$ formed by square-shaped non-contiguous beam spots arranged in a staggered or "zig-zag" pattern with a spacing equivalent to about the width of the beam spots. The irradiation pattern 1600$b$ may be scanned stepwise with each step being substantially the same as the width of the square beam spot such that the irradiation zones are contiguous in the stepwise direction, thereby forming a lift off pattern 1602$b$ of irradiation zones that causes separation of the layers. Although the irradiation pattern 1600$b$ shown in FIG. 16B is formed by four square-shaped beam spots with a spacing equivalent to one beam spot, similar irradiation patterns may be formed by more than four beam spots with a spacing of one beam spot or a spacing of some multiple of the beam spot. FIG. 16B-1 shows photomicrographs of a wafer irradiated with the "zig-zag" irradiation pattern 1600b.

FIG. 16C shows an irradiation pattern 1600c formed by square-shaped non-contiguous beam spots arranged in a triangular pattern. The irradiation pattern 1600c may be scanned stepwise with each step being substantially the same as the width of the square beam spot such that the irradiation zones are contiguous in the stepwise direction, thereby forming a lift off pattern 1602c of irradiation zones that causes separation of the layers.

FIG. 16D shows an irradiation pattern 1600d formed by a square-shaped non-contiguous beam spots arranged in a square matrix pattern. Similar to the irradiation pattern 1500g, this irradiation pattern is formed at different locations to interdigitate the sequential irradiations. As shown, the beam spots in this irradiation pattern 1600d are spaced such that multiple passes (i.e., sequential irradiations) are required to fill in an array of irradiation zones. For example, a second pass of the irradiation pattern 1600d forms the pattern 1602d, a third pass of the irradiation pattern 1600d forms the pattern 1604d, and a fourth pass of the irradiation pattern 1600d forms the complete lift off pattern 1606d that results in separation of the layers. Other numbers and spacings of the beam spots may also be used to form a matrix pattern.

Figure 16E:
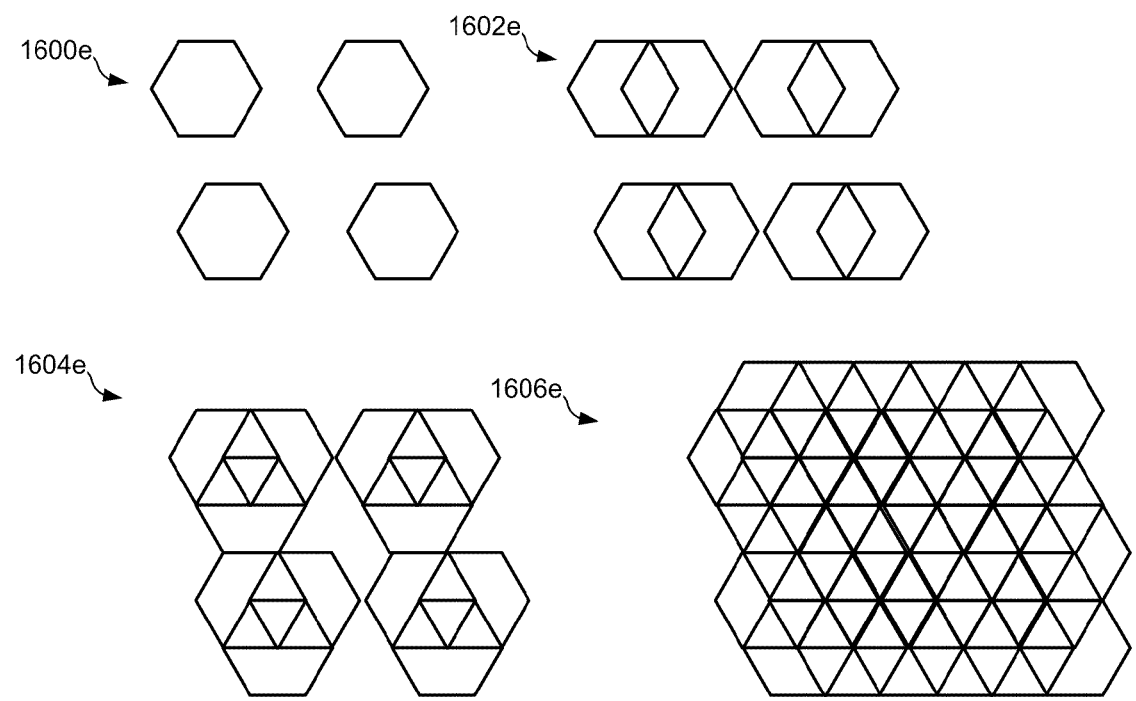

FIG. 16E shows an irradiation pattern 1600e formed by a hexagonal-shaped non-contiguous beam spots arranged in a square matrix pattern. This irradiation pattern is formed at different locations to interdigitate the sequential irradiations such that each of the hexagonal-shaped beam spots overlap similar to the hexagonal beam spot shown in FIG. 10C. As shown, the beam spots in this irradiation pattern 1600e are spaced such that multiple passes (i.e., sequential irradiations) are required to fill in an array of irradiation zones with the desired overlap. For example, a second pass of the irradiation pattern 1600e forms the pattern 1602e, a third pass of the irradiation pattern 1600e forms the pattern 1604e, and nine passes of the irradiation pattern 1600e forms the complete lift off pattern 1606e with three overlapping exposures in each location, resulting in separation of the layers. Other numbers and spacings of the hexagonal beam spots may also be used to form a matrix pattern. An irradiation pattern may also be formed with hexagonal-shaped beam spots being spaced such that lift off zones overlap without overlapping the irradiation zones.

Figure 17A:
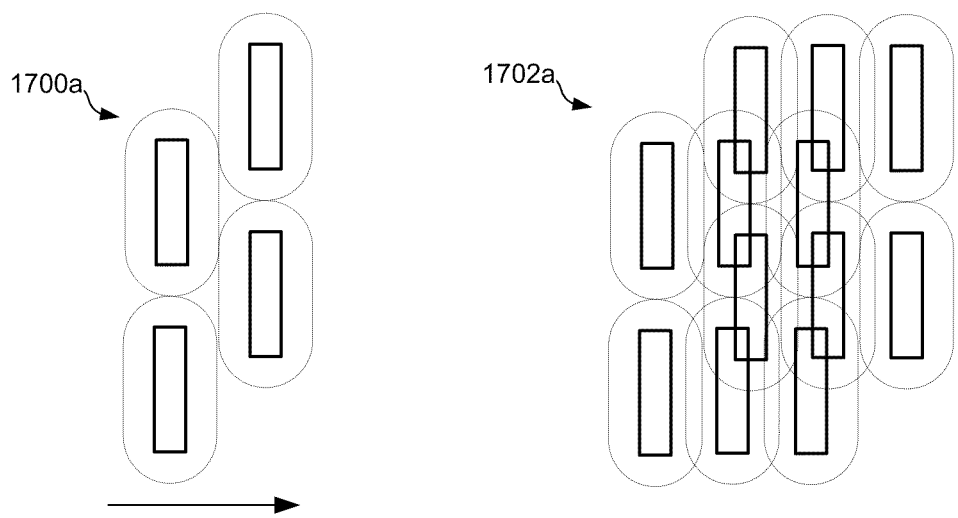
FIGS. 17A-17C are schematic illustrations of irradiation patterns formed by non-contiguous laser beam spots and lift off patterns formed by scanning the irradiation patterns for sequential irradiations with selected positive overlap.
Figure 17B:
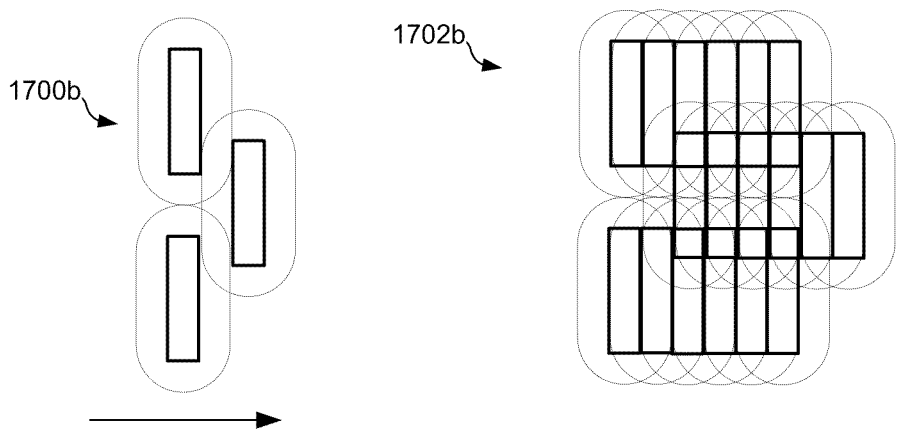
Figure 17C:
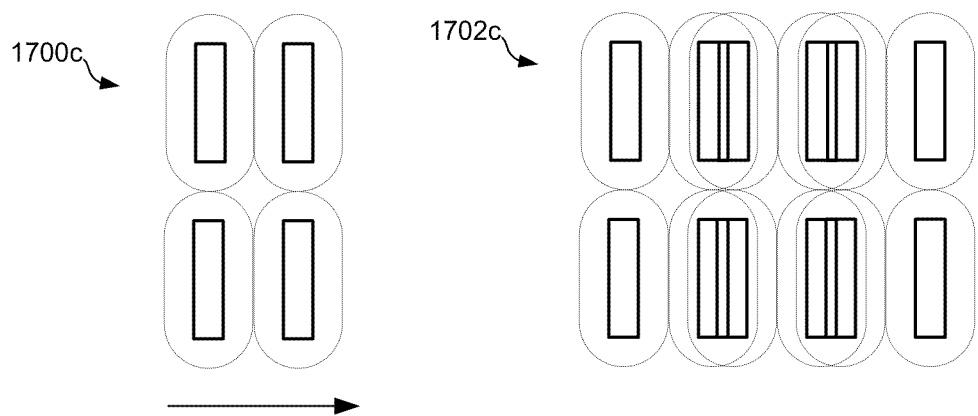

The irradiation patterns may also be scanned or positioned such that the irradiation zones in sequential irradiations overlap in selected areas of the lift off patterns, which may affect the amount of ablation that occurs in those areas. The irradiation pattern and the scanning may be configured to control the overlap and thus control the amount of ablation in the overlap areas, thereby providing various texturing or roughening effects on at least one of the layers (e.g., the GaN film being lifted off). FIGS. 17A-17C show irradiation patterns formed by non-contiguous beam spots, which may be scanned to form lift off patterns with some overlap of the edges of the irradiation zones in sequential irradiations to provide texturing or roughening. FIG. 17A shows an irradiation pattern 1700a that may be scanned to form a lift off pattern 1702a with intermittent overlapping irradiation zones. FIG. 17B shows an irradiation pattern 1700b that may be scanned to form a lift off pattern 1702b with overlapping irradiation zones formed along lines in the scanning direction. FIG. 17C shows an irradiation pattern 1700c that may be scanned to form a lift off pattern 1702c with intermittent overlapping irradiation zones extending in a direction orthogonal to the scanning direction. In the illustrated examples, the non-contiguous beam spots forming the irradiation patterns 1700a-c are relatively narrow in the scanning direction and relatively wide in the direction orthogonal to the scanning direction.

Figure 18A:
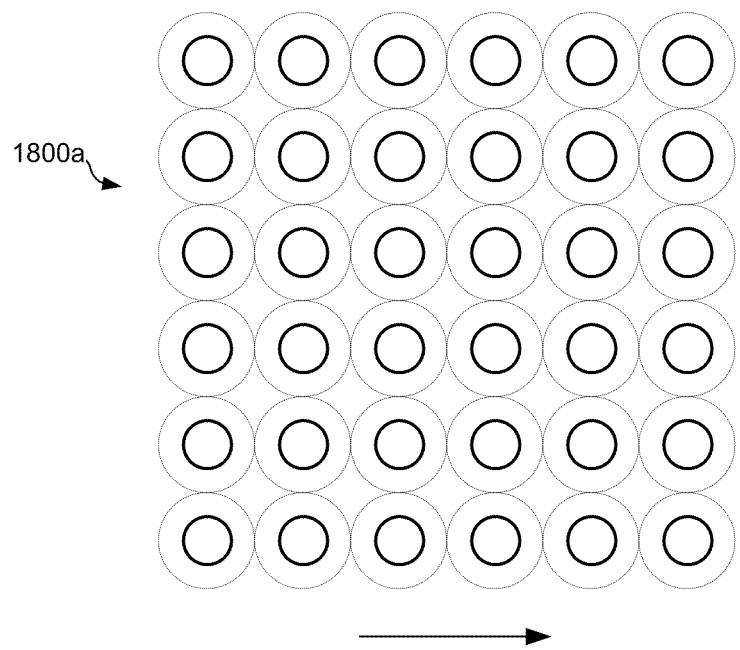
FIGS. 18A-18B are schematic illustrations of irradiation matrix patterns formed by non-contiguous circular beam spots.
Figure 18B:
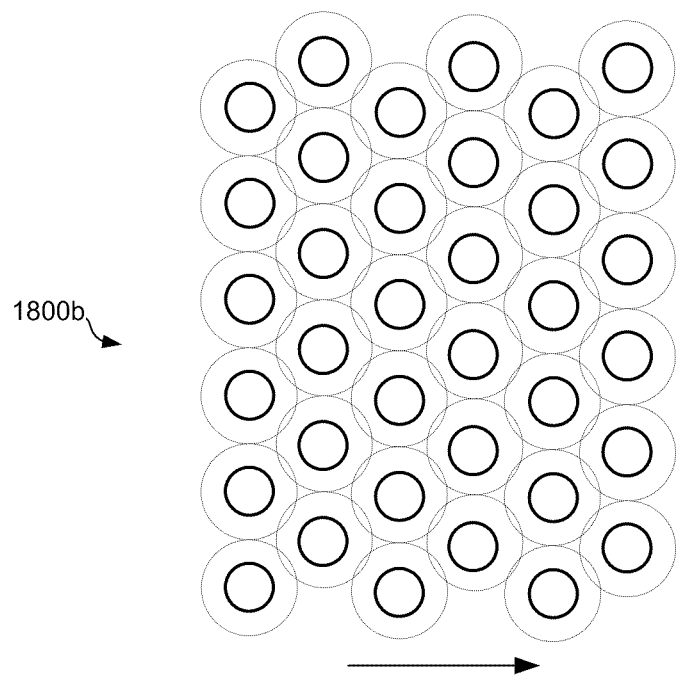

Although the irradiation patterns discussed above are shown with square, rectangular and hexagonal beam spots, these patterns may be formed using beam spots of any shape, number and spacing. FIGS. 18A and 18B, for example, show irradiation patterns 1800a, 1800b formed by high density arrays of circular beam spots. The irradiation patterns 1800a, 1800b may be formed, for example, by passing a laser through a high density mask such as an on-off mask with 10 micron diameter holes on 20 micron center to center pitch.

Figure 18C:
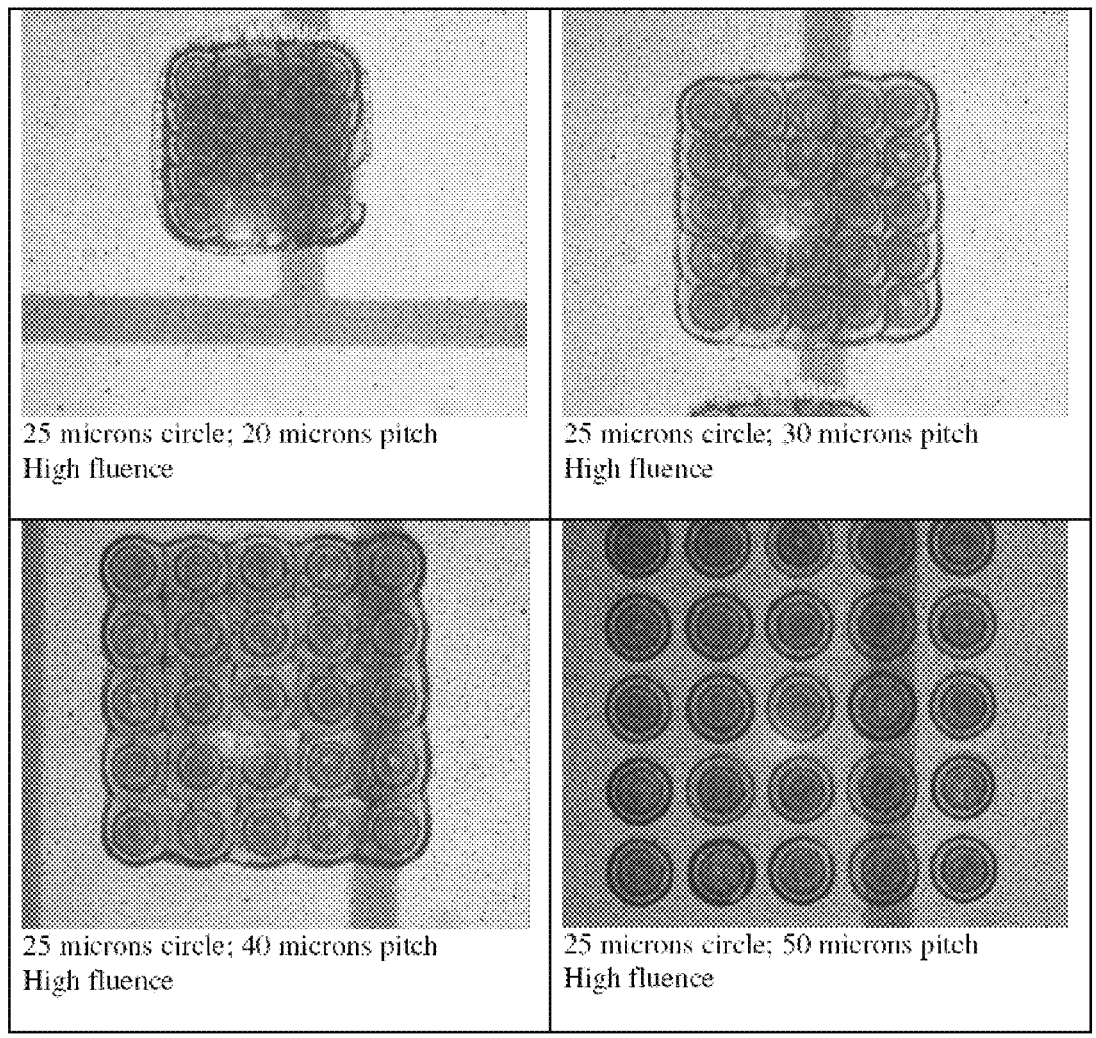
FIGS. 18C-18F are photomicrographs illustrating different irradiation patterns formed by a matrix of beam spots having different shapes, sizes, spacings and fluence levels.
Figure 18D:
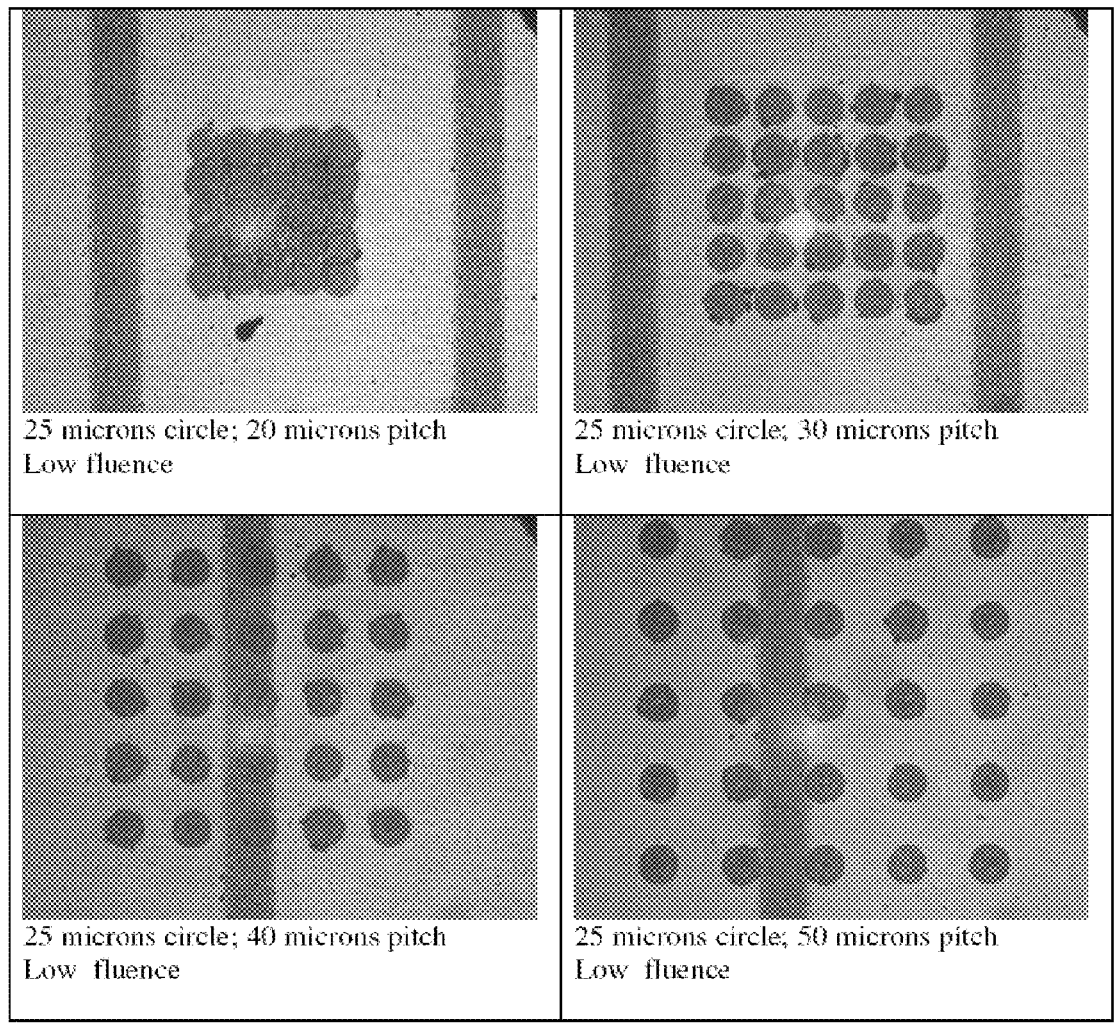
Figure 18E:
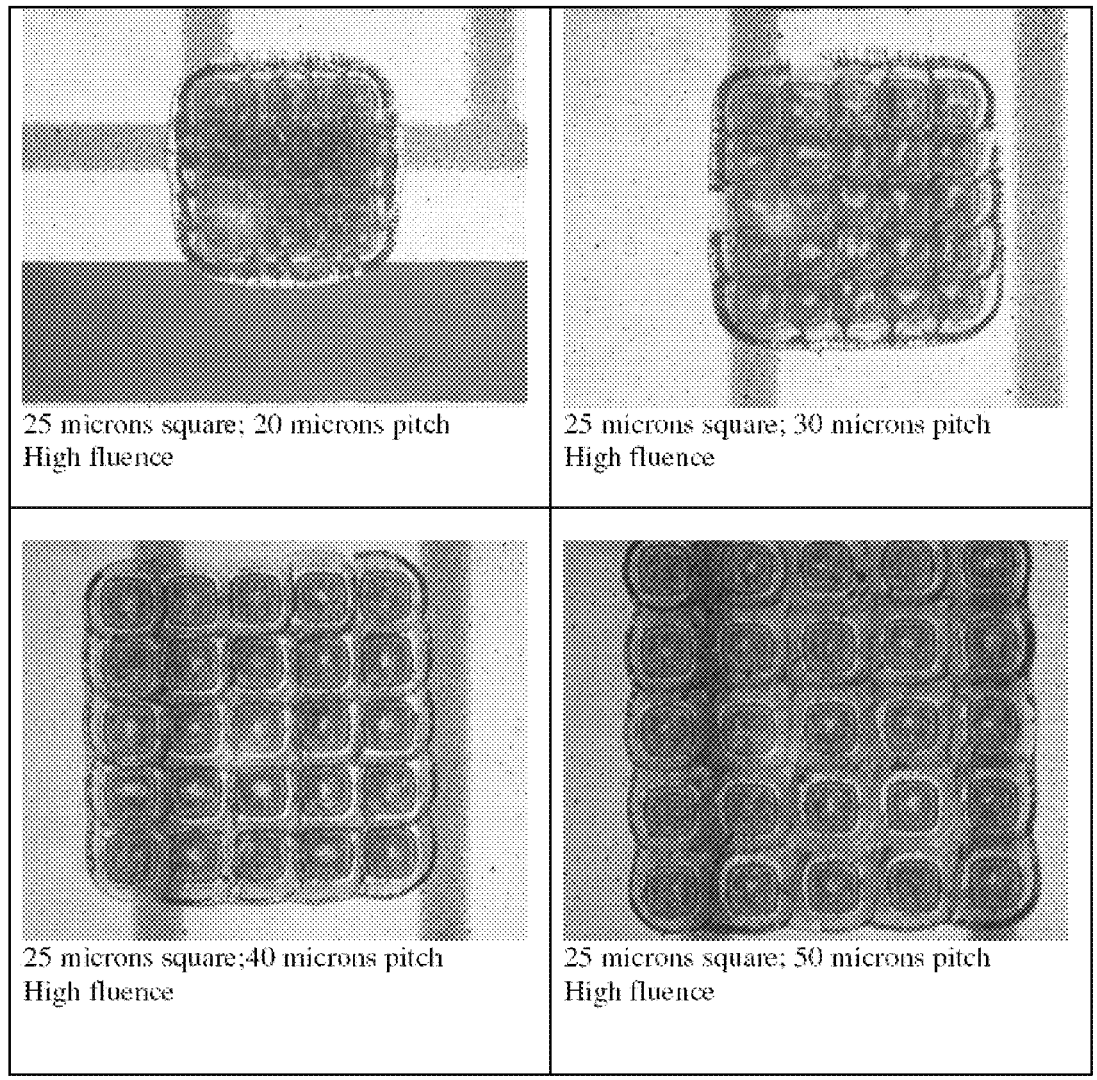
Figure 18F:
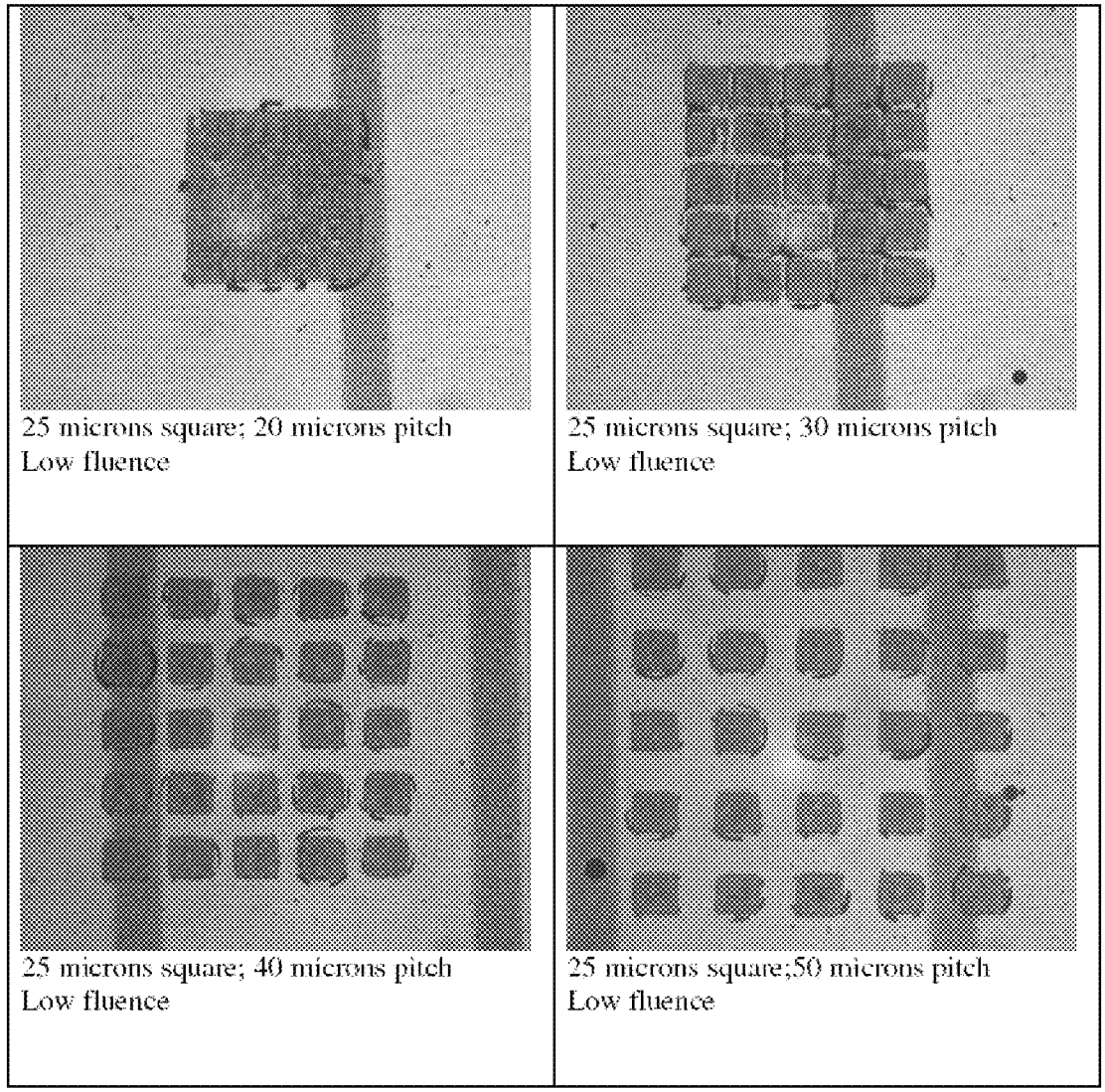

FIGS. 18C-18F show photomicrographs of irradiation patterns formed at the interface of a sapphire substrate and epi layer by arrays of beam spots with different pitches, different shapes and different fluence levels. The lift off zone may be seen in these photomicrographs around the irradiation zones. FIG. 18C shows photomicrographs of irradiation patterns formed by arrays of circular beam spots having different sizes and pitches and with a high fluence. FIG. 18D shows photomicrographs of irradiation patterns formed by arrays of circular beam spots having different sizes and pitches and with a low fluence. FIG. 18E shows photomicrographs of irradiation patterns formed by arrays of square beam spots having different sizes and pitches and with a high fluence. FIG. 18F shows photomicrographs of irradiation patterns formed by arrays of square beam spots having different sizes and pitches and with a low fluence. In these examples, the low fluence is just above the ablation threshold.

FIG. 18G shows a square-shaped irradiation pattern 1800g formed by multiple narrow line-shaped beam spots. In one example, line-shaped beam spots with a length of about 300 microns and width of about 3 microns may be spaced about 10 microns to form a square-shaped irradiation pattern of about 300 microns by 300 microns. The square-shaped irradiation pattern 1800g may be used in any of the irradiation patterns discussed above, for example, instead of a solid square-shaped beam spot and may be scanned or positioned across a workpiece using any of the techniques described above to achieve lift off. As shown in FIG. 18H, for example, multiple square-shaped irradiation patterns 1800g made up of narrow line-shaped beam spots may be arranged to form a larger irradiation pattern 1800h.

Multiple line-shaped beam spots of different sizes may also be arranged to form irradiation patterns of different sizes, shapes and/or geometries. As shown in FIG. 18I, for example, multiple narrow line-shaped beam spots may be arranged end-to-end to form a longer line-shaped irradiation pattern 1800i. In one example, line-shaped beam spots may be spaced only a few microns apart. The longer line-shaped irradiation pattern 1800i may be scanned across a workpiece, for example, instead of scanning a homogeneous line-shaped beam spot.

Instead of forming a square-shaped irradiation pattern with multiple narrow line-shaped beam spots as shown in FIG. 18G, small on/off beam spots may be used to form a larger irradiation pattern (e.g., a square shaped pattern of about 300 microns by 300 microns). FIG. 18J shows an irradiation pattern 1800f formed by multiple square-shaped irradiation patterns made up of small beam spots.

Figure 18K:
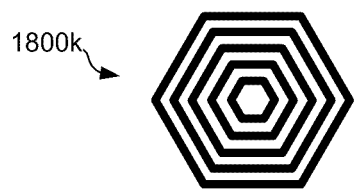
FIG. 18K is a schematic illustration of an irradiation pattern formed by multiple hexagonal shaped line beam spots.

FIG. 18K shows a hexagonal shaped irradiation pattern 1800k formed by multiple nested hexagon shaped lines beams (i.e., instead of a solid hexagonal beam spot). The hexagonal shaped irradiation pattern 1800k may be arranged with other hexagonal shaped irradiation patterns 1800k in a larger irradiation pattern. The hexagonal shaped irradiation pattern 1800k may also be scanned or positioned with varying degrees of overlap as described above with a solid hexagonal beam spot.

Figure 18N:
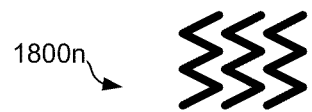
FIG. 18N is a schematic illustration of an irradiation pattern formed by multiple zig-zag shaped line beam spots.
Figure 18L:
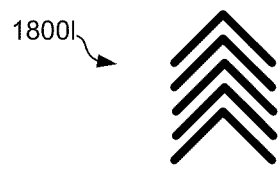
FIGS. 18L and 18M are schematic illustrations of a chevron shaped irradiation pattern formed by multiple angled line beam spots and an irradiation pattern formed by multiple chevron shaped irradiation patterns.

FIG. 18L shows a chevron shaped irradiation pattern 1800l formed by multiple angled line beams. The chevron shaped irradiation pattern 1800l may be scanned with varying degrees of overlap, for example, as described above with other patterns. Multiple chevron shaped irradiation patterns 1800l may also be formed in a larger irradiation pattern. FIG. 18M shows an irradiation pattern 1800m formed by multiple chevron-shaped irradiation patterns 1800l.

Figure 18O:
FIG. 18O is a schematic illustration of an irradiation pattern formed by multiple dashed shaped line beam spots.
Figure 18M:
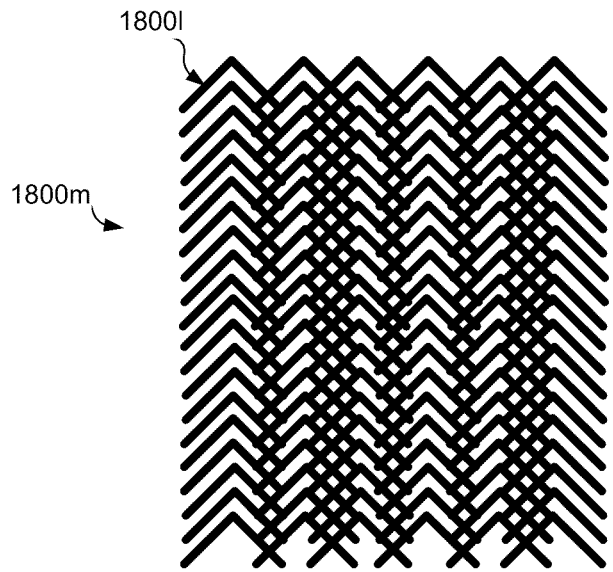

FIG. 18N shows an irradiation pattern 1800n formed by multiple zig-zag shaped line beams and FIG. 18O shows an irradiation patterns 1800o formed by multiple dashed line beams. These irradiation patterns 1800n, 1800o may also be scanned with varying degrees of overlap and/or may be formed in a larger irradiation pattern.

By forming irradiation patterns from multiple lines (e.g., as opposed to solid beam spots), the irradiation patterns may be overlapped with sequential radiation patterns with reduced cracking and ghosting effects. The multiple lines provide substantially uniform irradiation and allow the edges of the irradiation pattern to be blended with overlapping irradiation patterns. The irradiation patterns formed by multiple lines may also be overlapped to achieve a roughening effect on the layer being separated, for example, to roughen GaN for enhancing the LED performance. According to another variation, a solid beam spot may be formed in any of the shapes described herein with multiple lines at one or more edges of the solid beam spots to allow overlap with minimal or no ghosting. According to a further variation, a beam spot may be solid at the center with feathered edges.

The irradiation patterns including a plurality of lines or a solid beam spot with lines at the edges, as described above, may be formed by a photomask etched with the desired line pattern. One type of mask that may be used is a chrome/quartz on/off mask. The irradiation patterns including a plurality of lines may also be formed by shaping a beam from a high speed solid state laser to form the line pattern. A beam spot with feathered edges may be formed by a gray scale mask.

Figure 19A:
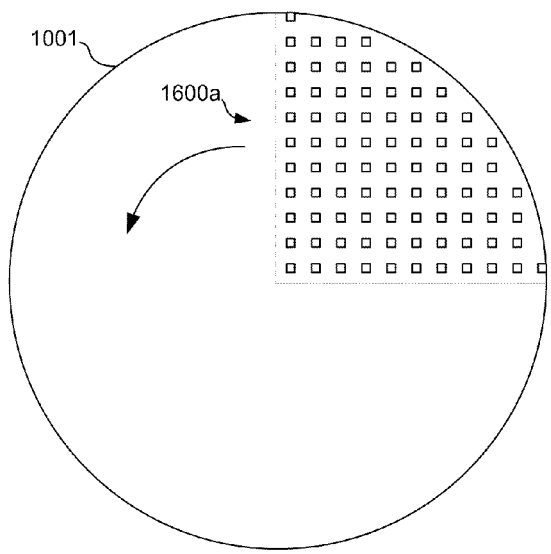
FIGS. 19A-19D are schematic illustrations of irradiation patterns formed by non-contiguous laser beam spots scanned on a circular shaped workpiece.

FIGS. 19A-19D show irradiation patterns (with an aggregate LOZ shown in broken lines) that are designed to irradiate a circular workpiece 1001 such as a semiconductor wafer. In FIG. 19A, an irradiation pattern 1600a is formed by non-contiguous beam spots arranged in a pie-shaped pattern extending from the center to the circumference of the circular workpiece 1001. The irradiation pattern 1600a and/or the workpiece 1001 may be rotated to scan the irradiation pattern 1600a around the workpiece. Although the pie-shaped irradiation pattern 1600a is shown as a one-quarter circle, larger or smaller pie-shaped patterns may be used.

Figure 19B:
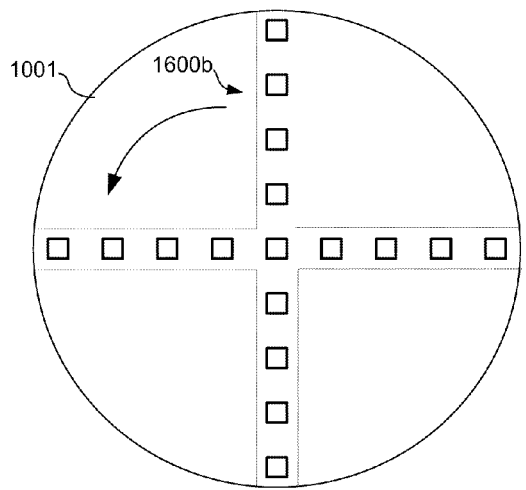

In FIG. 19B, an irradiation pattern 1600b is formed by non-contiguous beam spots arranged in a spoke pattern extending from the center to the circumference of the circular workpiece 1001. The irradiation pattern 1600b and/or the workpiece 1001 may be rotated to scan the irradiation pattern 1600a around the workpiece. Although the spoke irradiation pattern 1600b is shown with four (4) spokes, other numbers of spokes may also be used.

Figure 19C:
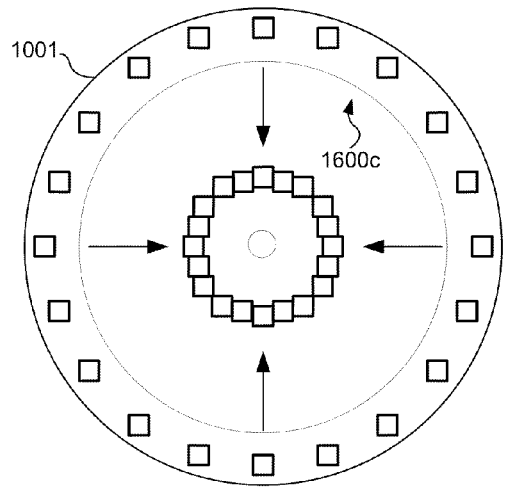

In FIG. 19C, an irradiation pattern 1600c is formed by non-contiguous beam spots arranged in an annular pattern around the workpiece 1001. The annular irradiation pattern 1600c may be scanned from the circumference to the center of the workpiece 1001 by moving the beam spots inwardly.

Figure 19D:
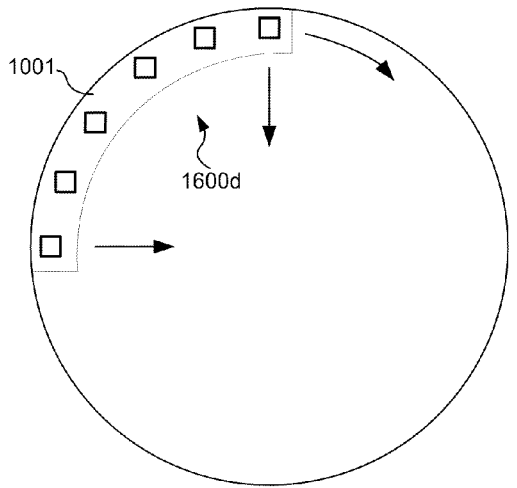

In FIG. 19D, an irradiation pattern 1600d is formed by non-contiguous beam spots arranged in a semi-annular or arc pattern around the workpiece 1001. The semi-annular irradiation pattern 1600d may be scanned around the circumference workpiece 1001 and may be scanned inwardly from the circumference to the center of the workpiece 1001.

The size, shape and number of beam spots used to form the irradiation patterns 1600a-d may be varied depending upon the size of the workpiece, the materials and the desired energy density.

Figure 20A:
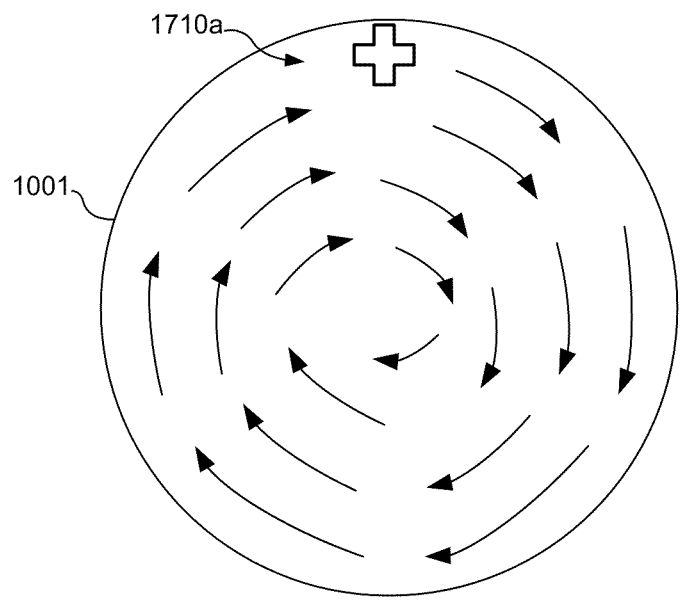
FIG. 20A is a schematic illustration of a beam spot moving in a spiral pattern to irradiate a circular shaped workpiece.
Figure 20B:
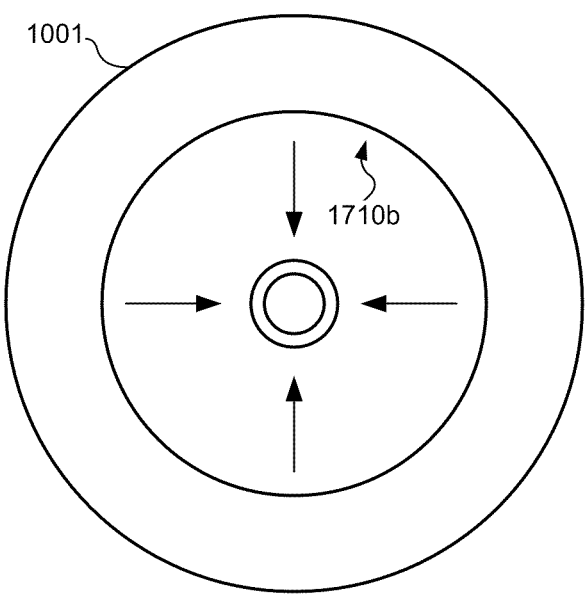
FIG. 20B is a schematic illustration of an annular beam spot moving to irradiate a circular shaped workpiece.

FIGS. 20A and 20B show other techniques for scanning beam spots to perform laser lift off on a circular shaped workpiece 1001. In FIG. 20A, a beam spot 1710a (e.g., having a cross shape) may be scanned around the workpiece 1001 in a spiral pattern. In one embodiment, the beam spot 1710a may be moved in the spiral pattern, for example, using a galvanometer. In another embodiment, the beam spot 1710a may be moved radially toward the center while the workpiece 1001 is rotated. Although a cross-shaped beam spot is shown, a beam spot or array of beam spots with other shapes may also be scanned in a spiral direction.

In FIG. 20B, an annular beam spot 1710b may be scanned inwardly with a decreasing diameter and width as the beam spot moves. The annular beam spot 1710b may be formed, for example, using an acoustic lens. The annular beam spot 1710b may also be formed as a defocused annular beam that maintains energy density while the width and arc length changes as the beam is scanned inwardly. In another variation, a variable diameter narrow ring of laser light may be scanned from the outside to the center, for example, using an electro optic effect.

Consistent with one embodiment, a laser lift off method is provided for separating layers of material. The method includes: providing a workpiece including at least first and second layers of material; generating at least one laser beam; and irradiating non-contiguous irradiation zones at an interface between the first and second layers with a beam spot formed by the at least one laser beam, wherein lift off zones are formed around each of the irradiation zones at the interface and extending beyond the dimensions of the irradiation zones, wherein laser energy from the laser beam irradiating the irradiation zones is sufficient to cause separation of the layers in the lift off zones.

Consistent with another embodiment, a laser lift off method is provided for separating at least one layer of material from at least one substrate. The method includes: providing at least one substrate having at least one layer of material formed thereon; generating a plurality of laser beamlets; simultaneously irradiating an irradiation pattern with a pattern of beam spots formed by the laser beamlets, the irradiation pattern including non-contiguous irradiation zones at an interface between the layer and the substrate; and moving the irradiation pattern to different locations for sequential irradiations until the layer is separated from the substrate.

Consistent with a further embodiment, a laser lift off method includes: providing a workpiece including at least first and second layers of material; generating at least one laser beam; and irradiating overlapping irradiation zones at an interface between the first and second layers with a beam spot formed by the at least one laser beam and moved in a stepwise direction, wherein the irradiation zones are overlapped such that a substantial number of the locations at the interface are exposed to the same number of pulses of laser irradiation, wherein the number of pulses of laser irradiation at the locations is sufficient to cause separation of the layers.

Consistent with yet another embodiment, a laser lift off system includes: a laser for generating a raw laser beam; a beam shaper for shaping the raw laser beam into a shaped beam; and a spot array generator for receiving the shaped beam and generating an array of non-contiguous beam spots arranged in a predefined pattern.

Consistent with yet another embodiment, a laser lift off system includes: a laser for generating a raw laser beam; a beam shaper for shaping the raw laser beam into a shaped beam and for changing the energy density of the beam; and a galvanometer for scanning the shaped beam spot on the workpiece.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A laser lift off method for separating layers of material, the method comprising:
    providing a workpiece including at least first and second layers of material;
    generating at least one laser beam; and
    irradiating non-contiguous irradiation zones at an interface between the first and second layers with a beam spot formed by the at least one laser beam, wherein lift off zones are formed around each of the irradiation zones at the interface and extending beyond the dimensions of the irradiation zones, wherein laser energy from the laser beam irradiating the irradiation zones is sufficient to cause separation of the layers in the lift off zones, wherein irradiating the non-contiguous irradiation zones includes performing sequential irradiations of at least one irradiation zone until the layers are separated throughout the entire workpiece, wherein the sequential irradiations are non-contiguous.

2. The laser lift off method of claim 1 further comprising moving the workpiece in between the sequential irradiations.

3. The laser lift off method of claim 1 further comprising moving the at least one laser beam in between the sequential irradiations.

4. The laser lift off method of claim 1 wherein generating at least one laser beam includes generating a raw laser beam and forming a plurality of beamlets, and wherein the beamlets are spaced to irradiate at least a subset of the non-contiguous irradiation zones simultaneously.

5. The laser lift off method of claim 4 wherein forming the plurality of beamlets includes passing the raw laser beam through a diffractive optical element.

6. The laser lift off method of claim 1 wherein at least some of the beam spots are line-shaped.

7. The laser lift off method of claim 1 wherein at least some of the beam spots are cross-shaped.

8. The laser lift off method of claim 1 wherein at least some of the beam spots are L-shaped.

9. The laser lift off method of claim 1 wherein irradiating the non-contiguous irradiation zones includes forming a plurality of beam spots simultaneously on the workpiece to irradiate irradiation zones arranged in an irradiation pattern, wherein the beam spots irradiating the irradiation pattern have different shapes.

10. The laser lift off method of claim 1 wherein generating the laser beam includes generating an ultrashort pulse laser beam using an ultrafast laser.

11. The laser lift off method of claim 10 wherein the ultrashort pulse laser beam has a pulse width less than 10 picoseconds and a wavelength in a range of about 0.35 µm to 1 µm.

12. The laser lift off method of claim 10 wherein generating the laser beam includes generating the laser beam with a pulse duration of up to about 200 nanoseconds.

13. The laser lift off method of claim 10 wherein generating the laser beam includes generating the laser beam with an excimer laser having a wavelength in a range of about 157 to 355 nm.

14. The laser lift off method of claim 10 wherein generating the laser beam further includes shaping the ultrashort pulse laser beam to control the energy density of the beam spot formed at the interface of the layers.

15. The laser lift off method of claim 1 wherein the first and second layers include a substrate and at least one film formed on the substrate.

16. The laser lift off method of claim 15 wherein the film is separated monolithically from the substrate of the workpiece.

17. The laser lift off method of claim 15 wherein the substrate is a sapphire substrate, and wherein the at least one film is a GaN film.

18. The laser lift off method of claim 1 wherein the layers are mechanically held together when separating the layers.

19. The laser lift off method of claim 1 wherein one of the layers is made of a transparent material, and another of the layers is made of an absorbent material to be separated from the transparent material.

20. A laser lift off method for separating layers of material, the method comprising:
    providing a workpiece including at least first and second layers of material;
    generating at least one laser beam; and
    irradiating non-contiguous irradiation zones at an interface between the first and second layers with a beam spot formed by the at least one laser beam, wherein lift off zones are formed around each of the irradiation zones at the interface and extending beyond the dimensions of the irradiation zones, wherein laser energy from the laser beam irradiating the irradiation zones is sufficient to cause separation of the layers in the lift off zones, wherein irradiating the non-contiguous irradiation zones includes performing sequential irradiations of a plurality of simultaneous irradiation zones arranged in an irradiation pattern until the layers are separated throughout the entire workpiece, wherein the simultaneous irradiation zones in the irradiation pattern are non-contiguous.

21. The laser lift off method of claim 20 wherein the plurality of simultaneous irradiation zones are arranged in a circular irradiation pattern.

22. The laser lift off method of claim 20 wherein the plurality of simultaneous irradiation zones are arranged in a wedge shaped irradiation pattern.

23. The laser lift off method of claim 20 wherein the sequential irradiations are performed by interdigitating the plurality of simultaneous irradiation zones.

24. A laser lift off method for separating at least one layer of material from at least one substrate, the method comprising:
    providing at least one substrate having at least one layer of material formed thereon;
    generating a plurality of laser beamlets;
    simultaneously irradiating an irradiation pattern with a pattern of beam spots formed by the laser beamlets, the irradiation pattern including non-contiguous irradiation zones at an interface between the layer and the substrate; and moving the irradiation pattern to different locations for sequential irradiations until the layer is separated from the substrate, wherein the irradiation pattern is moved such that the irradiation zones have zero overlapping or negative overlapping.

25. The laser lift off method of claim 24 wherein the overlapping is different for different axes.

26. The laser lift off method of claim 24 wherein the irradiation pattern is moved by linear scanning across a workpiece.

27. The laser lift off method of claim 24 wherein the irradiation pattern is moved by interdigitated scanning across a workpiece.

28. The laser lift off method of claim 24 wherein the irradiation pattern is moved by moving the workpiece.

29. The laser lift off method of claim 24 wherein the irradiation pattern is moved by moving the beamlets.

30. A laser lift off method for separating layers of material, the method comprising:

providing a workpiece including at least first and second layers of material;

generating a raw laser beam and passing the raw laser beam through a diffractive optical element to form a plurality of beamlets, wherein the beamlets are spaced to irradiate at least a subset of the non-contiguous irradiation zones simultaneously; and irradiating non-contiguous irradiation zones at an interface between the first and second layers with a beam spot formed by the at least one laser beam, wherein lift off zones are formed around each of the irradiation zones at the interface and extending beyond the dimensions of the irradiation zones, wherein laser energy from the laser beam irradiating the irradiation zones is sufficient to cause separation of the layers in the lift off zones.

* * * * *